(12) United States Patent
Hong

(10) Patent No.: US 10,789,887 B2
(45) Date of Patent: Sep. 29, 2020

(54) IMAGE DISPLAY APPARATUS

(71) Applicant: LG ELECTRONICS INC., Seoul (KR)

(72) Inventor: Beduero Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/161,254

(22) Filed: Oct. 16, 2018

(65) Prior Publication Data

US 2019/0114969 A1  Apr. 18, 2019

(30) Foreign Application Priority Data

Oct. 18, 2017 (KR) ........................ 10-2017-0135355

(51) Int. Cl.
*G09G 3/3258* (2016.01)
*H01L 27/32* (2006.01)
(Continued)

(52) U.S. Cl.
CPC ......... *G09G 3/3258* (2013.01); *G09G 3/3233* (2013.01); *G09G 3/3266* (2013.01); *H01L 27/3297* (2013.01); *H02M 1/36* (2013.01); *H02M 7/02* (2013.01); *H02M 7/42* (2013.01); *G09G 2300/0842* (2013.01);
(Continued)

(58) Field of Classification Search
CPC ......... G09G 3/3233; G09G 2320/0233; G09G 2310/08; G09G 2300/0842
See application file for complete search history.

(56) References Cited

U.S. PATENT DOCUMENTS

| 2005/0128171 A1* | 6/2005 | Chen ................ G09G 3/3688 345/87 |
| 2007/0040826 A1* | 2/2007 | Lee .................... G06F 1/26 345/211 |

(Continued)

FOREIGN PATENT DOCUMENTS

| KR | 10-2014-0058166 | 5/2014 |
| KR | 10-2016-0032394 | 3/2016 |

(Continued)

OTHER PUBLICATIONS

International Search Report dated Feb. 26, 2019 issued in Application No. PCT/KR2018/011970.

*Primary Examiner* — Shaheda A Abdin
(74) *Attorney, Agent, or Firm* — KED & Associates LLP

(57) ABSTRACT

The present invention relates to an image display apparatus. The image display apparatus includes a display; a processor configured to control to supply a power to the display; and a power supply configured to convert an input AC power and output converted first DC power and second DC power to the processor and the display, wherein the power supply comprises a discharging unit configured to discharge the first DC power when a supply of the AC power to the power supply is stopped, wherein the processor is configured to supply the second DC power to the display according to a level of a voltage outputted from the discharging unit, when the supply of the AC power to the power supply is stopped and then supplied again. Accordingly, when the AC power is supplied to the power supply of the image display apparatus, the display can be quickly turned on.

17 Claims, 21 Drawing Sheets

(51) Int. Cl.
  *H02M 7/42*   (2006.01)
  *H02M 7/02*   (2006.01)
  *G09G 3/3266* (2016.01)
  *G09G 3/3233* (2016.01)
  *H02M 1/36*   (2007.01)
  *H02M 1/00*   (2006.01)

(52) U.S. Cl.
  CPC . *G09G 2330/022* (2013.01); *G09G 2330/026* (2013.01); *H02M 2001/0032* (2013.01)

(56) References Cited

U.S. PATENT DOCUMENTS

2016/0043629 A1* 2/2016 Joo .................. H02M 1/36
                                         363/55
2017/0186372 A1* 6/2017 Yanase ............. G09G 3/3233

FOREIGN PATENT DOCUMENTS

| KR | 10-2016-0088964 | 7/2016 |
| KR | 10-2016-0139688 | 12/2016 |

* cited by examiner

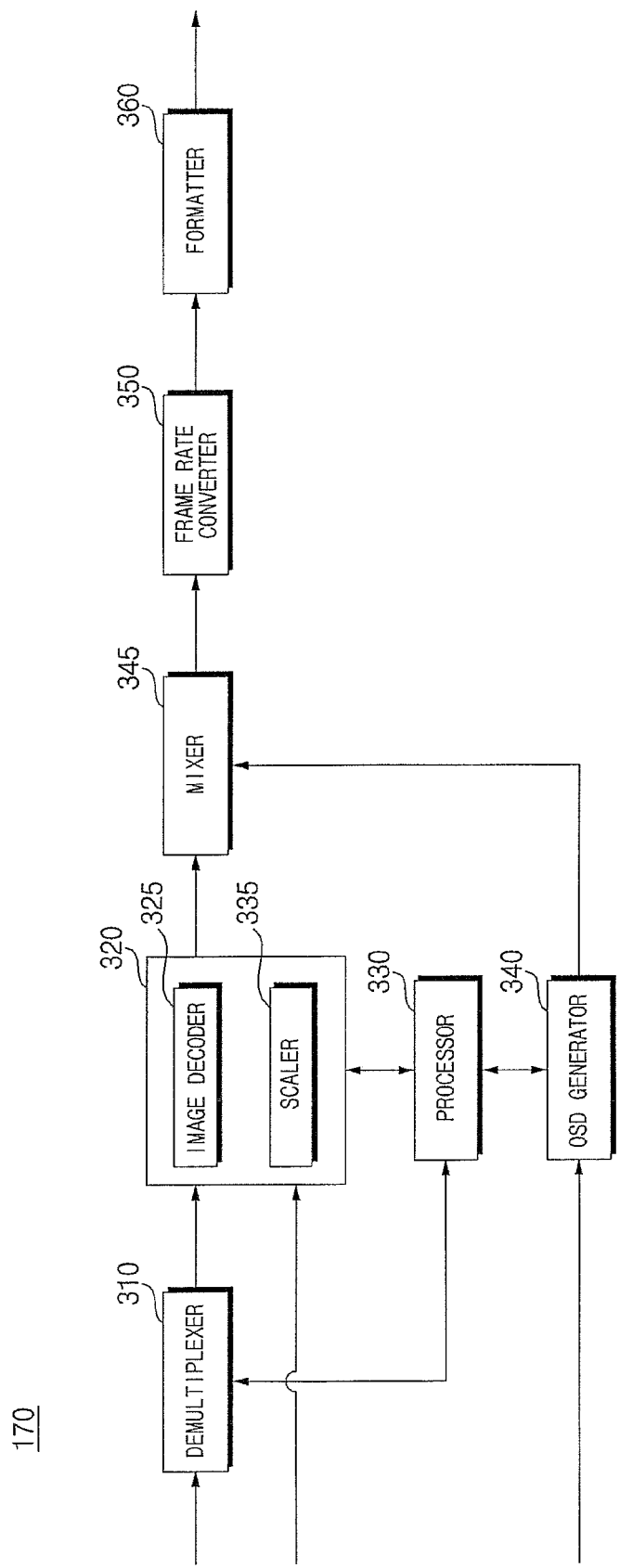

(a)            (b)            (c)

IMAGE DISPLAY APPARATUS

CROSS-REFERENCE TO RELATED APPLICATION

This application claims the priority benefit of Korean Patent Application No. 10-2017-0135355, filed on Oct. 18, 2017 in the Korean Intellectual Property Office, the disclosure of which is incorporated herein by reference.

BACKGROUND OF THE INVENTION

1. Field of the Invention

The present invention relates to an image display apparatus, and more particularly, to an image display apparatus capable of quickly turning on a display when AC power is supplied to a power supply of the image display apparatus.

2. Description of the Related Art

An image display apparatus is an apparatus having a function of providing an image that a user can watch. The user can watch various images through the image display apparatus.

Particularly, the image display apparatus can display a broadcast image. The image display apparatus can provide a user-selected broadcast signal among broadcast signals transmitted from a broadcast station, and the broadcast image can be displayed on a display.

Meanwhile, the image display apparatus can display an image by using any one of various types of panels. In recent years, there has been an increase in the use of an organic light emitting diode panel having a clear image quality in the image display apparatus.

Meanwhile, when a liquid crystal display panel or the organic light emitting diode panel is turned on by an AC power, a minimum turn-on standby period should be set in view of the characteristics of a device.

Accordingly, various methods for quickly turning on a panel in consideration of the minimum turn-on standby period have been researched.

SUMMARY OF THE INVENTION

It is an object of the present invention to provide an image display apparatus capable of quickly turning on a display, when AC power is supplied to a power supply of the image display apparatus.

It is another object of the present invention to provide an image display apparatus capable of quickly turning on a display, in consideration of a minimum turn-on standby period of display set on a display having an organic light emitting diode panel, when AC power is supplied to a power supply.

In accordance with an aspect of the present invention, an image display apparatus includes: a display; a processor configured to control to supply a power to the display; and a power supply configured to convert an input AC power and output converted first DC power and second DC power to the processor and the display, wherein the power supply comprises a discharging unit configured to discharge the first DC power when a supply of the AC power to the power supply is stopped, wherein the processor is configured to supply the second DC power to the display according to a level of a voltage outputted from the discharging unit, when the supply of the AC power to the power supply is stopped and then supplied again.

In accordance with another aspect of the present invention, an image display apparatus includes: a display; a processor configured to control to supply a power to the display; and a power supply configured to convert an input AC power and output converted first DC power and second DC power to the processor and the display, wherein the power supply outputs a voltage level that gradually descends when a supply of the AC power is stopped, wherein the processor is configured to supply the second DC power to the display according to a voltage level from the power supply, when the supply of the AC power to the power supply is stopped and then supplied again.

BRIEF DESCRIPTION OF THE DRAWINGS

The above and other objects, features and other advantages of the present invention will be more clearly understood from the following detailed description taken in conjunction with the accompanying drawings, in which:

FIG. 3 is an example of an internal block diagram of a controller of FIG. 2;

DETAILED DESCRIPTION OF THE PREFERRED EMBODIMENTS

Hereinafter, the present invention will be described in detail with reference to the accompanying drawings. With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
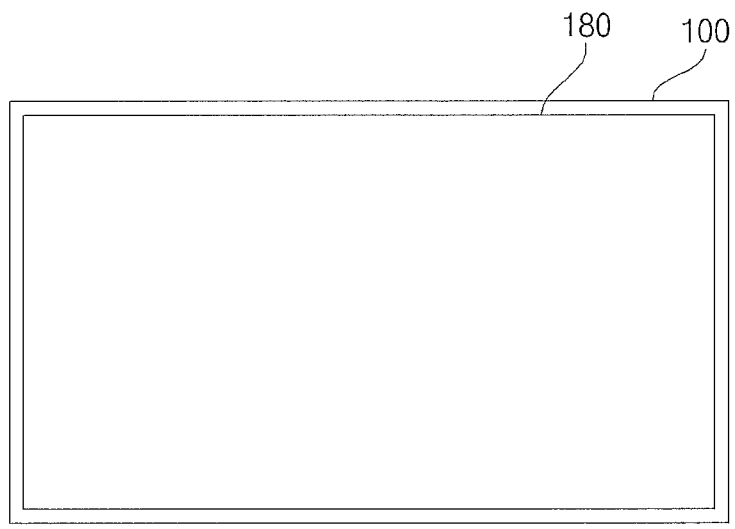
FIG. 1 is a diagram illustrating an image display apparatus according to an embodiment of the present invention.

FIG. 1 is a diagram illustrating an image display apparatus according to an embodiment of the present invention.

Referring to the drawing, an image display apparatus 100 may include a display 180.

Meanwhile, the display 180 may be implemented with any one of various panels. For example, the display 180 may be any one of a liquid crystal display panel (LCD panel), an organic light emitting diode panel (OLED panel), an light emitting diode panel (LED panel).

In the present invention, the organic light emitting diode panel (OLED panel) is mainly described as the display 180.

Meanwhile, it is preferable that the organic light emitting diode panel (OLED panel) is set to have a longer minimum turn-on standby period of the display 180 than the liquid crystal display panel.

For example, if the minimum turn-on standby period of the liquid crystal display panel is approximately 1 second, the minimum turn-on standby period of the organic light emitting diode panel (OLED panel) may be set to approximately 3 seconds. Such a minimum turn-on standby period can be variously set.

Meanwhile, when an AC power Vac is supplied to a power supply 190 of the image display apparatus 100, simply and at low cost, while considering the minimum turn-on standby period of the display 180, the present invention suggests a method of quickly turning on the display 180.

In detail, the image display apparatus 100 according to an embodiment of the present invention includes an organic light emitting diode panel 210 and a controller 170 or 232 for controlling the organic light emitting diode panel 210.

When an image to be displayed on the organic light emitting diode panel 210 is a moving image, the display 180 displays, in a first period, a part of a first frame image in a first area of the organic light emitting diode panel 210, displays a part of a second frame image preceding the first frame image in a second area excluding the first area of the organic light emitting diode panel 210, and displays a black image (Black) in the entire area of the organic light emitting diode panel 210 in a second period after the first period, thereby improving a response speed of the panel 210 during the display of moving image.

The image display apparatus 100 according to an embodiment of the present invention includes a display 180, a processor 750 (of FIG. 12) for controlling power supply to the display 180, and a power supply 190 (of FIG. 12) for converting an input AC power Vac, and outputting converted first DC power V1 and second DC power VDD to the processor 750 and the display 180. The power supply 190 includes a discharging unit 760 (of FIG. 12) for discharging the first DC power V1 when the supply of the AC power Vac to the power supply 190 is stopped. When the supply of the AC power Vac is stopped and then supplied again to the power supply 190, the processor 750 controls the second DC power VDD to be supplied to the display 180 according to the level of the voltage output from the discharging unit 760. Thus, when the AC power Vac is supplied to the power supply 190 of the image display apparatus 100, the display 180 can be quickly turned on.

Particularly, when the level of the voltage output from the discharging unit 760 at the time of re-supply of the AC power Vac to the power supply 190 is equal to or lower than a reference value Vth, the second DC power VDD is controlled to be supplied to the display 180. Thus, the display 180 can be quickly turned on when the AC power Vac is supplied to the power supply 190 of the image display apparatus 100.

Meanwhile, when the level of the voltage output from the discharging unit 760 at the time of re-supply of the AC power Vac to the power supply 190 exceeds the reference value Vth, the second DC power VDD is controlled not to be supplied to the display 180 so that the minimum turn-on standby period of the display 180 set in the display 180 can be maintained.

Then, by controlling the second DC power VDD to be supplied to the display 180 after the level of the voltage output from the discharging unit 760 reaches the reference value Vth, the display 180 can be quickly turned on in consideration of the minimum turn-on standby period of the display 180 set in the display 180.

Meanwhile, when the supply of the AC power Vac to the power supply 190 is stopped, a period when the level of the first DC power V1 descends from a first level V1 to the reference voltage Vth is designed to correspond to the minimum turn-on standby period of the display 180, so that the display 180 can be quickly turned on in consideration of the minimum turn-on standby period of the display 180 set in the display 180.

Meanwhile, during the minimum turn-on standby period, the voltage stored in a storage capacitor Cst of each pixel of the organic light emitting diode panel is lowered to the ground voltage GND, thereby enabling accurate image display.

Meanwhile, since a standby unit 725 is removed from the power supply 190, the manufacturing cost of the power supply 190 is reduced.

Meanwhile, the processor 750 includes a voltage detector E2 for detecting a voltage level input from the discharging unit 760. When the level of the voltage detected by the voltage detector E2 at the time of the re-supply of the AC power Vac to the power supply 190 is equal to or lower than the reference value Vth, the processor 750 controls the second DC power VDD to be supplied to the display 180. Thus, in consideration of the minimum turn-on standby period of the display 180, the display 180 can be quickly turned on, and further, the manufacturing cost can be reduced.

The image display apparatus 100 according to another embodiment of the present invention includes a display 180, a processor 750 for controlling power supply to the display 180, and a power supply 190 for converting an input AC power Vac, and outputting converted first DC power V1 and second DC power VDD to the processor 750 and the display 180. The power supply 190 outputs a voltage level that gradually descends when the supply of the AC power Vac is stopped.

When the supply of the AC power Vac to the power supply 190 is stopped and then supplied again, the processor 750 controls the second DC power VDD to be supplied to the display 180 according to the voltage level from the power supply 190, so that the display 180 can be turned on quickly when the AC power Vac is supplied to the power supply 190 of the image display apparatus 100.

Particularly, when the supply of AC power to the power supply 190 is stopped and then supplied again, when the voltage level from the power supply 190 is equal to or lower than a reference value Vth, the second DC power VDD is controlled to be supplied to the power supply 190, so that the display 180 can be turned on quickly when the AC power Vac is supplied to the power supply 190 of the image display apparatus 100.

Meanwhile, when the voltage level from the power supply 190 at the time of the re-supply of the AC power Vac to the power supply 190 exceeds the reference value Vth, the second DC power VDD is controlled not to be supplied to the display 180, so that the minimum turn-on standby period of the display 180 set in the display 180 can be kept.

The second DC power VDD is controlled to be supplied to the display 180 after the voltage level from the power supply 190 reaches the reference value Vth, so that the display 180 can be turned on quickly in consideration of the minimum turn-on standby period of the display 180 set in display 180.

Various operation methods of the image display apparatus 100 according to the embodiment of the present invention will be described in more detail with reference to FIG. 12.

Meanwhile, the image display apparatus 100 of FIG. 1 may be a monitor, a TV, a tablet PC, a mobile terminal, or the like.

Figure 2:
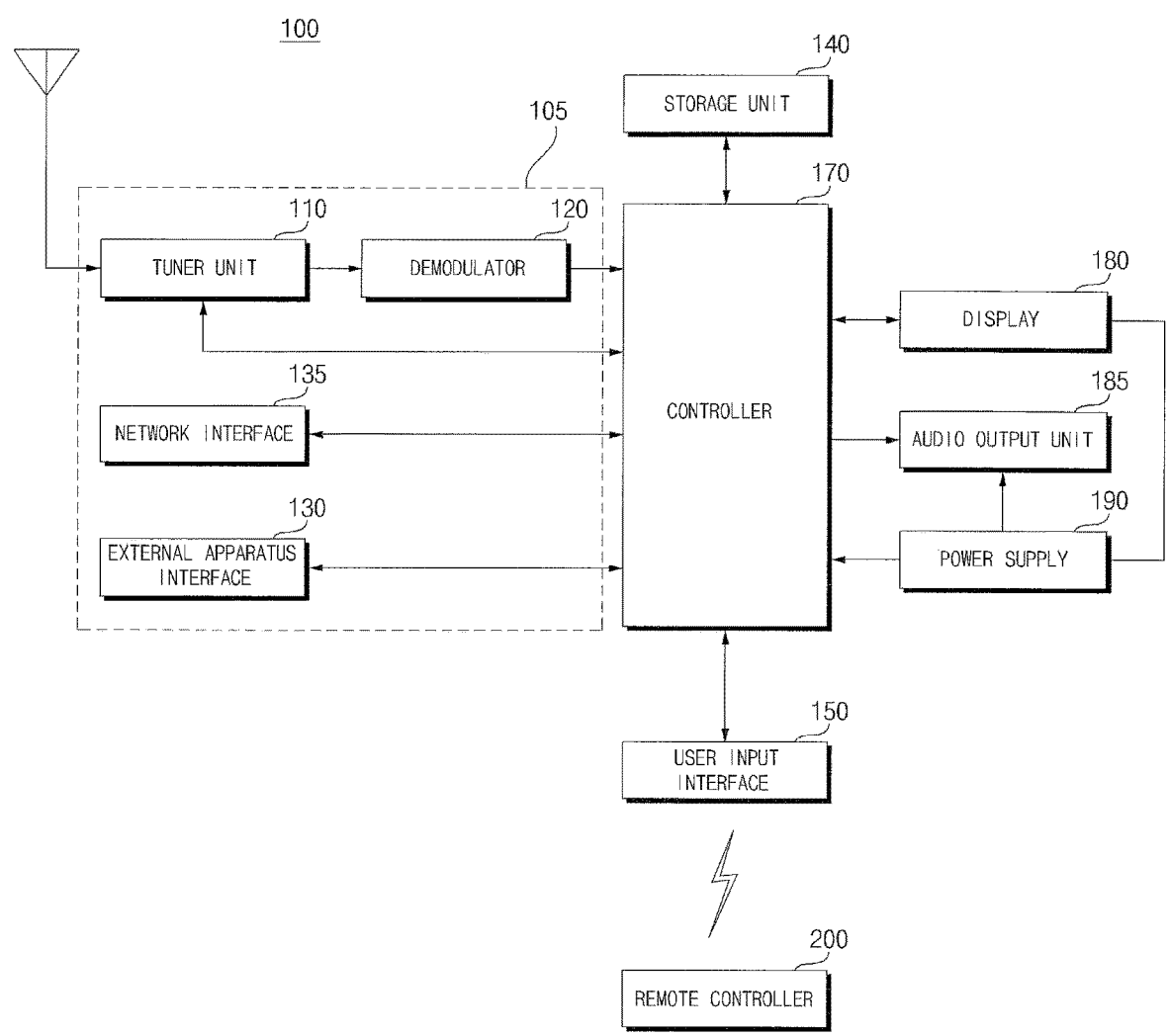
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present invention includes a broadcast receiving unit 105, a storage unit 140, a user input interface 150, a sensor unit (not shown), a controller 170, a display 180, and an audio output unit 185.

The broadcast receiving unit 105 may include a tuner unit 110, a demodulator 120, a network interface 135, and an external apparatus interface 130.

Meanwhile, unlike the drawing, the broadcast receiving unit 105 may include only the tuner unit 110, the demodulator 120, and the external apparatus interface 130. That is, the network interface 135 may not be included.

The tuner unit 110 selects an RF broadcast signal corresponding to a channel selected by a user or all pre-stored channels among radio frequency (RF) broadcast signals received through an antenna (not shown). In addition, the selected RF broadcast signal is converted into an intermediate frequency signal, a baseband image, or a audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner unit 110 can process a digital broadcast signal or an analog broadcast signal. The analog baseband image or audio signal (CVBS/SIF) output from the tuner unit 110 may be directly input to the controller 170.

Meanwhile, the tuner unit 110 can include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner unit 110 and performs a demodulation operation.

The demodulator 120 may perform demodulation and channel decoding and then output a stream signal TS. At this time, the stream signal may be a multiplexed signal of an image signal, a audio signal, or a data signal.

The stream signal output from the demodulator 120 may be input to the controller 170. The controller 170 performs demultiplexing, image/audio signal processing, and the like, and then outputs an image to the display 180 and outputs audio to the audio output unit 185.

The external apparatus interface 130 may transmit or receive data with a connected external apparatus (not shown), e.g., a set-top box 50. To this end, the external apparatus interface 130 may include an A/V input and output unit (not shown).

The external apparatus interface 130 may be connected in wired or wirelessly to an external apparatus such as a digital versatile disk (DVD), a Blu ray, a game equipment, a camera, a camcorder, a computer (note book), and a set-top box, and may perform an input/output operation with an external apparatus.

The A/V input and output unit may receive image and audio signals from an external apparatus. Meanwhile, a wireless communication unit (not shown) may perform short-range wireless communication with other electronic apparatus.

Through the wireless communication unit (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network. For example, the network interface 135 may receive, via the network, content or data provided by the Internet, a content provider, or a network operator.

Meanwhile, the network interface 135 may include a wireless communication unit (not shown).

The storage unit 140 may store a program for each signal processing and control in the controller 170, and may store signal-processed image, audio, or data signal.

In addition, the storage unit 140 may serve to temporarily store image, audio, or data signal input to the external apparatus interface 130. In addition, the storage unit 140 may store information on a certain broadcast channel through a channel memory function such as a channel map.

Although FIG. 2 illustrates that the storage unit is provided separately from the controller 170, the scope of the present invention is not limited thereto. The storage unit 140 may be included in the controller 170.

The user input interface 150 transmits a signal input by the user to the controller 170 or transmits a signal from the controller 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the controller 170, may transfer a user input signal input from a sensor unit (not shown) that senses a user's gesture to the controller 170, or may transmit a signal from the controller 170 to the sensor unit (not shown).

The controller 170 may demultiplex the input stream through the tuner unit 110, the demodulator 120, the network interface 135, or the external apparatus interface 130, or process the demultiplexed signals to generate and output a signal for image or audio output.

The image signal processed by the controller 170 is input to the display 180, and may be displayed as an image corresponding to the image signal. In addition, the image signal processed by the controller 170 may be input to the external output apparatus through the external apparatus interface 130.

The audio signal processed by the controller 170 may be output to the audio output unit 185 as an audio signal. In addition, audio signal processed by the controller 170 may be input to the external output apparatus through the external apparatus interface 130.

Although not shown in FIG. 2, the controller 170 may include a demultiplexer, an image processor, and the like. This will be described later with reference to FIG. 3.

In addition, the controller 170 can control the overall operation of the image display apparatus 100. For example, the controller 170 may control the tuner unit 110 to control the tuning of the RF broadcast corresponding to the channel selected by the user or the previously stored channel.

In addition, the controller 170 may control the image display apparatus 100 according to a user command input through the user input interface 150 or an internal program.

Meanwhile, the controller 170 may control the display 180 to display an image. At this time, the image displayed on the display 180 may be a still image or a moving image, and may be a 2D image or a 3D image.

Meanwhile, the controller 170 may display a certain object in an image displayed on the display 180. For example, the object may be at least one of a connected web screen (newspaper, magazine, etc.), an electronic program guide (EPG), various menus, a widget, an icon, a still image, a moving image, and a text.

Meanwhile, the controller 170 may recognize the position of the user based on the image photographed by a photographing unit (not shown). For example, the distance (z-axis coordinate) between a user and the image display apparatus 100 can be determined. In addition, the x-axis coordinate and the y-axis coordinate in the display 180 corresponding to a user position can be determined.

The display 180 generates a driving signal by converting an image signal, a data signal, an OSD signal, a control signal processed by the controller 170, an image signal, a data signal, a control signal, and the like received from the external apparatus interface 130.

Meanwhile, the display 180 may be configured as a touch screen and used as an input device in addition to an output device.

The audio output unit 185 receives a signal processed by the controller 170 and outputs it as an audio.

The photographing unit (not shown) photographs a user. The photographing unit (not shown) may be implemented by a single camera, but the present invention is not limited thereto and may be implemented by a plurality of cameras. Image information photographed by the photographing unit (not shown) may be input to the controller 170.

The controller 170 may sense a gesture of the user based on each of the images photographed by the photographing unit (not shown), the signals detected from the sensor unit (not shown), or a combination thereof.

The power supply 190 supplies corresponding power to the image display apparatus 100. Particularly, the power may be supplied to a controller 170 which can be implemented in the form of a system on chip (SOC), a display 180 for displaying an image, and an audio output unit 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present invention. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present invention, and specific operation and apparatus do not limit the scope of the present invention.

FIG. 3 is an example of an internal block diagram of a controller of FIG. 2.

Referring to the drawing, the controller 170 according to an embodiment of the present invention may include a demultiplexer 310, an image processing unit 320, a processor 330, an OSD generator 340, a mixer 345, a frame rate converter 350, and a formatter 360. In addition, it may further include an audio processing unit (not shown), and a data processing unit (not shown).

The demultiplexer 310 demultiplexes the input stream. For example, when an MPEG-2 TS is input, it can be demultiplexed into image, audio, and data signal, respectively. Here, the stream signal input to the demultiplexer 310 may be a stream signal output from the tuner unit 110, the demodulator 120, or the external apparatus interface 130.

The image processing unit 320 may perform image processing of the demultiplexed image signal. To this end, the image processing unit 320 may include an image decoder 325 and a scaler 335.

The image decoder 325 decodes the demultiplexed image signal, and the scaler 335 performs scaling so that the resolution of the decoded image signal can be output from the display 180.

The image decoder 325 can include a decoder of various standards. For example, a 3D image decoder for MPEG-2, H.264 decoder, a color image, and a depth image, and a decoder for a multiple view image may be provided.

The processor 330 may control the overall operation of the image display apparatus 100 or the controller 170. For example, the processor 330 may control the tuner 110 to accomplish the tuning of an RF broadcast corresponding to a channel selected by the user or a previously stored channel.

In addition, the processor 330 may control the image display apparatus 100 by a user command input through the user input interface 150 or an internal program.

In addition, the processor 330 may perform a control of data transmission with the network interface 135 or the external apparatus interface 130.

In addition, the processor 330 may control operations of the demultiplexing unit 310, the image processing unit 320, the OSD generator 340, and the like in the controller 170.

The OSD generator 340 generates an OSD signal according to a user input or by itself. For example, based on a user input signal, the OSD generator 340 may generate a signal for displaying various information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD generator 340 may generate a pointer that can be displayed on the display, based on a pointing signal input from the remote controller 200. In particular, such a pointer may be generated by a pointing signal processing unit, and the OSD generator 340 may include such a pointing signal processing unit (not shown). Obviously, the pointing signal processing unit (not shown) may be provided separately from the OSD generator 340.

The mixer 345 may mix an OSD signal generated by the OSD generator 340 with a decoded image signal image-processed by the image processing unit 320. The mixed image signal is supplied to the frame rate converter 350.

The frame rate converter (FRC) 350 may convert the frame rate of an input image. Meanwhile, the frame rate converter 350 can also directly output the frame rate without any additional frame rate conversion.

Meanwhile, the formatter 360 may convert the format of an input image signal into a image signal for display on the display and output it.

The formatter 360 may change the format of the image signal. For example, it may change the format of the 3D image signal into any one of various 3D formats such as a side by side format, a top/down format, a frame sequential format, an interlaced format, a checker box format, and the like.

Meanwhile, the audio processing unit (not shown) in the controller 170 may perform the audio processing of the demultiplexed audio signal. To this end, the audio processing unit (not shown) may include various decoders.

In addition, the audio processing unit (not shown) in the controller 170 may process a base, a treble, a volume control, and the like.

The data processing unit (not shown) in the controller 170 may perform data processing of the demultiplexed data signal. For example, when the demultiplexed data signal is a coded data signal, it can be decoded. The encoded data signal may be electronic program guide information including broadcast information such as a start time and an end time of a broadcast program broadcasted on each channel.

Meanwhile, a block diagram of the controller 170 shown in FIG. 3 is a block diagram for an embodiment of the present invention. Each component of the block diagram may be integrated, added, or omitted according to a specification of the controller 170 actually implemented.

In particular, the frame rate converter 350 and the formatter 360 may not be provided in the controller 170, but may be separately provided or may be provided as a separate single module.

Figure 4A:
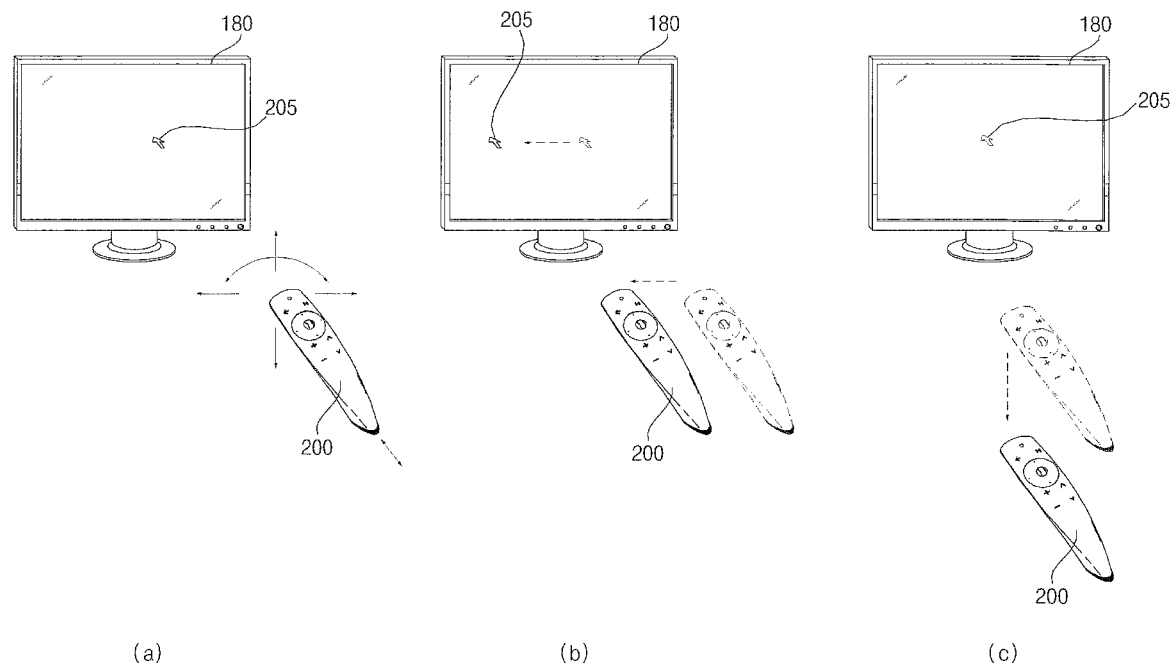
FIG. 4A is a diagram illustrating a control method of a remote controller of FIG. 2.

FIG. 4A is a diagram illustrating a control method of a remote controller of FIG. 2.

As shown in FIG. 4A(a), it is illustrated that a pointer 205 corresponding to the remote controller 200 is displayed on the display 180.

The user may move or rotate the remote controller 200 up and down, left and right (FIG. 4A(b)), and back and forth (FIG. 4A(c)). The pointer 205 displayed on the display 180 of the image display apparatus corresponds to the motion of the remote controller 200. Such a remote controller 200 may be referred to as a space remote controller or a 3D pointing apparatus, because the pointer 205 is moved and displayed according to the movement in a 3D space, as shown in the drawing.

FIG. 4A(b) illustrates that when the user moves the remote controller 200 to the left, the pointer 205 displayed on the display 180 of the image display apparatus also moves to the left correspondingly.

Information on the motion of the remote controller 200 detected through a sensor of the remote controller 200 is transmitted to the image display apparatus. The image display apparatus may calculate the coordinate of the pointer 205 from the information on the motion of the remote controller 200. The image display apparatus may display the pointer 205 to correspond to the calculated coordinate.

FIG. 4A(c) illustrates a case where the user moves the remote controller 200 away from the display 180 while pressing a specific button of the remote controller 200. Thus, a selection area within the display 180 corresponding to the pointer 205 may be zoomed in so that it can be displayed to be enlarged. On the other hand, when the user moves the remote controller 200 close to the display 180, the selection area within the display 180 corresponding to the pointer 205 may be zoomed out so that it can be displayed to be reduced. Meanwhile, when the remote controller 200 moves away from the display 180, the selection area may be zoomed out, and when the remote controller 200 approaches the display 180, the selection area may be zoomed in.

Meanwhile, when the specific button of the remote controller 200 is pressed, it is possible to exclude the recognition of vertical and lateral movement. That is, when the remote controller 200 moves away from or approaches the display 180, the up, down, left, and right movements are not recognized, and only the forward and backward movements are recognized. Only the pointer 205 is moved according to the up, down, left, and right movements of the remote controller 200 in a state where the specific button of the remote controller 200 is not pressed.

Meanwhile, the moving speed or the moving direction of the pointer 205 may correspond to the moving speed or the moving direction of the remote controller 200.

Figure 4B:
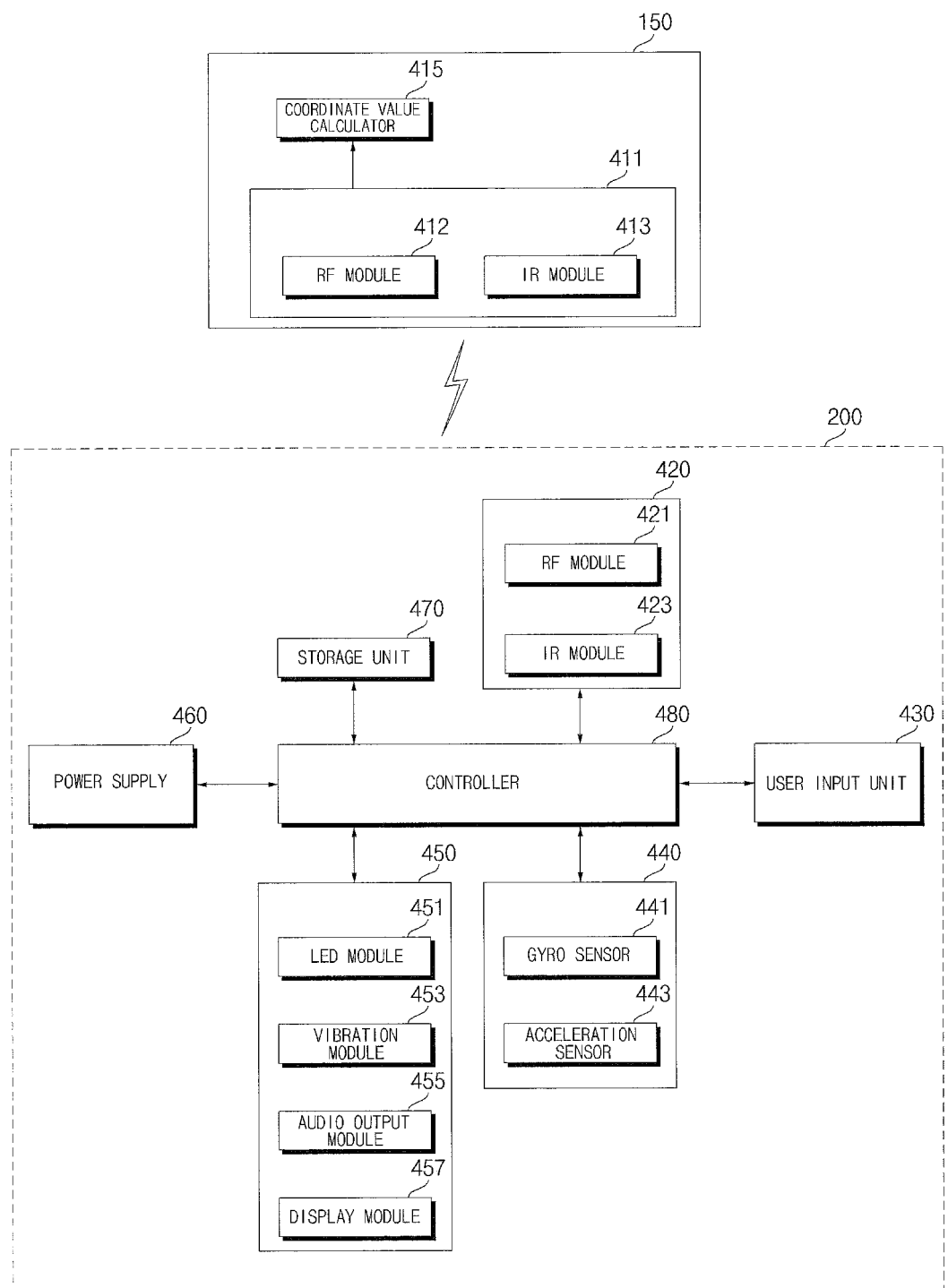
FIG. 4B is an internal block diagram of the remote controller of FIG. 2.

FIG. 4B is an internal block diagram of the remote controller of FIG. 2.

Referring to the drawing, the remote controller 200 includes a wireless communication unit 425, a user input unit 435, a sensor unit 440, an output unit 450, a power supply 460, a storage unit 470, and a controller 480.

The wireless communication unit 425 transmits/receives a signal to/from any one of the image display apparatuses according to the embodiments of the present invention described above. Among the image display apparatuses according to the embodiments of the present invention, one image display apparatus 100 will be described as an example.

In the present embodiment, the remote controller 200 may include an RF module 421 for transmitting and receiving signals to and from the image display apparatus 100 according to a RF communication standard. In addition, the remote controller 200 may include an IR module 423 for transmitting and receiving signals to and from the image display apparatus 100 according to a IR communication standard.

In the present embodiment, the remote controller 200 transmits a signal containing information on the motion of the remote controller 200 to the image display apparatus 100 through the RF module 421.

In addition, the remote controller 200 may receive the signal transmitted by the image display apparatus 100 through the RF module 421. In addition, if necessary, the remote controller 200 may transmit a command related to power on/off, channel change, volume change, and the like to the image display apparatus 100 through the IR module 423.

The user input unit 435 may be implemented by a keypad, a button, a touch pad, a touch screen, or the like. The user may operate the user input unit 435 to input a command related to the image display apparatus 100 to the remote controller 200. When the user input unit 435 includes a hard key button, the user can input a command related to the image display apparatus 100 to the remote controller 200 through a push operation of the hard key button. When the user input unit 435 includes a touch screen, the user may touch a soft key of the touch screen to input the command related to the image display apparatus 100 to the remote controller 200. In addition, the user input unit 435 may include various types of input means such as a scroll key, a jog key, etc., which can be operated by the user, and the present invention does not limit the scope of the present invention.

The sensor unit 440 may include a gyro sensor 441 or an acceleration sensor 443. The gyro sensor 441 may sense information about the motion of the remote controller 200.

For example, the gyro sensor 441 may sense information on the operation of the remote controller 200 based on the x, y, and z axes. The acceleration sensor 443 may sense information on the moving speed of the remote controller 200. Meanwhile, a distance measuring sensor may be further provided, and thus, the distance to the display 180 may be sensed.

The output unit 450 may output an image or an audio signal corresponding to the operation of the user input unit 435 or a signal transmitted from the image display apparatus 100. Through the output unit 450, the user may recognize whether the user input unit 435 is operated or whether the image display apparatus 100 is controlled.

For example, the output unit 450 may include an LED module 451 that is turned on when the user input unit 435 is operated or a signal is transmitted/received to/from the image display apparatus 100 through the wireless communication unit 425, a vibration module 453 for generating a vibration, an audio output module 455 for outputting an audio, or a display module 457 for outputting an image.

The power supply 460 supplies power to the remote controller 200. When the remote controller 200 is not moved for a certain time, the power supply 460 may stop the supply of power to reduce a power waste. The power supply 460 may resume power supply when a certain key provided in the remote controller 200 is operated.

The storage unit 470 may store various types of programs, application data, and the like necessary for the control or operation of the remote controller 200. If the remote controller 200 wirelessly transmits and receives a signal to/from the image display apparatus 100 through the RF module 421, the remote controller 200 and the image display apparatus 100 transmit and receive a signal through a certain frequency band. The controller 480 of the remote controller 200 may store information about a frequency band or the like for wirelessly transmitting and receiving a signal to/from the image display apparatus 100 paired with the remote controller 200 in the storage unit 470 and may refer to the stored information.

The controller 480 controls various matters related to the control of the remote controller 200. The controller 480 may transmit a signal corresponding to a certain key operation of the user input unit 435 or a signal corresponding to the motion of the remote controller 200 sensed by the sensor unit 440 to the image display apparatus 100 through the wireless communication unit 425.

The user input interface 150 of the image display apparatus 100 includes a wireless communication unit 151 that can wirelessly transmit and receive a signal to and from the remote controller 200 and a coordinate value calculator 415 that can calculate the coordinate value of a pointer corresponding to the operation of the remote controller 200.

The user input interface 150 may wirelessly transmit and receive a signal to and from the remote controller 200 through the RF module 412. In addition, the user input interface 150 may receive a signal transmitted by the remote controller 200 through the IR module 413 according to a IR communication standard.

The coordinate value calculator 415 may correct a hand shake or an error from a signal corresponding to the operation of the remote controller 200 received through the wireless communication unit 151 and calculate the coordinate value (x, y) of the pointer 205 to be displayed on the display 180.

The transmission signal of the remote controller 200 inputted to the image display apparatus 100 through the user input interface 150 is transmitted to the controller 180 of the image display apparatus 100. The controller 180 may determine the information on the operation of the remote controller 200 and the key operation from the signal transmitted from the remote controller 200, and, correspondingly, control the image display apparatus 100.

For another example, the remote controller 200 may calculate the pointer coordinate value corresponding to the operation and output it to the user input interface 150 of the image display apparatus 100. In this case, the user input interface 150 of the image display apparatus 100 may transmit information on the received pointer coordinate value to the controller 180 without a separate correction process of hand shake or error.

For another example, unlike the drawing, the coordinate value calculator 415 may be provided in the controller 170, not in the user input interface 150.

Figure 5:
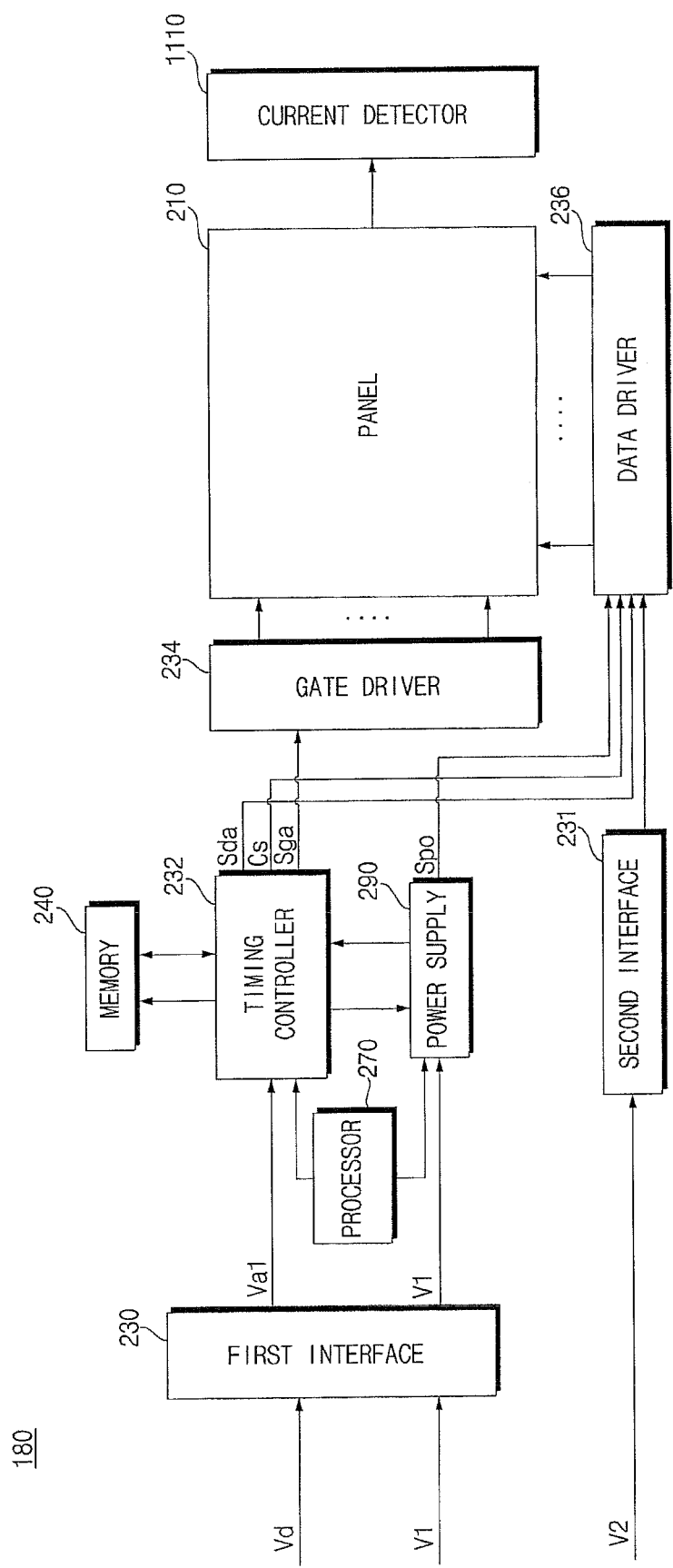
FIG. 5 is an internal block diagram of a display of FIG. 2.

FIG. 5 is an internal block diagram of a display of FIG. 2.

Referring to FIG. 5, the organic light emitting diode panel-based display 180 may include an organic light emitting diode panel 210, a first interface 230, a second interface 231, a timing controller 232, a gate driver 234, a data driver 236, a memory 240, a processor 270, a power supply 290, a current detector 1110, and the like.

The display 180 receives an image signal Vd, a first DC power V1, and a second DC power V2, and may display a certain image based on the image signal Vd.

Meanwhile, the first interface 230 in the display 180 may receive the image signal Vd and the first DC power V1 from the controller 170.

Here, the first DC power V1 may be used for the operation of the power supply 290 and the timing controller 232 in the display 180.

Next, the second interface 231 may receive a second DC power V2 from an external power supply 190. Meanwhile, the second DC power V2 may be input to the data driver 236 in the display 180.

The timing controller 232 may output a data driving signal Sda and a gate driving signal Sga, based on the image signal Vd.

For example, when the first interface 230 converts the input image signal Vd and outputs the converted image signal va1, the timing controller 232 may output the data driving signal Sda and the gate driving signal Sga based on the converted image signal va1.

The timing controller 232 may further receive a control signal, a vertical synchronization signal Vsync, and the like, in addition to the image signal Vd from the controller 170.

In addition to the image signal Vd, based on a control signal, a vertical synchronization signal Vsync, and the like, the timing controller 232 generates a gate driving signal Sga for the operation of the gate driver 234, and a data driving signal Sda for the operation of the data driver 236.

At this time, when the panel 210 includes a RGBW subpixel, the data driving signal Sda may be a data driving signal for driving of RGBW subpixel.

Meanwhile, the timing controller 232 may further output a control signal Cs to the gate driver 234.

The gate driver 234 and the data driver 236 supply a scan signal and an image signal to the organic light emitting diode panel 210 through a gate line GL and a data line DL respectively, according to the gate driving signal Sga and the data driving signal Sda from the timing controller 232. Accordingly, the organic light emitting diode panel 210 displays a certain image.

Meanwhile, the organic light emitting diode panel 210 may include an organic light emitting layer. In order to display an image, a plurality of gate lines GL and data lines DL may be disposed in a matrix form in each pixel corresponding to the organic light emitting layer.

Meanwhile, the data driver 236 may output a data signal to the organic light emitting diode panel 210 based on a second DC power V2 from the second interface 231.

The power supply 290 may supply various power supplies to the gate driver 234, the data driver 236, the timing controller 232, and the like.

The current detector 1110 may detect the current flowing in a sub-pixel of the organic light emitting diode panel 210. The detected current may be input to the processor 270 or the like, for a cumulative current calculation.

The processor 270 may perform each type of control of the display 180. For example, the processor 270 may control the gate driver 234, the data driver 236, the timing controller 232, and the like.

Meanwhile, the processor 270 may receive current information flowing in the sub-pixel of the organic light emitting diode panel 210 from the current detector 1110. In addition, the processor 270 may calculate the accumulated current of the subpixel of each organic light emitting diode panel 210, based on information of current flowing through the sub-pixel of the organic light emitting diode panel 210. The calculated accumulated current may be stored in the memory 240. Meanwhile, the processor 270 may determine as burn-in, if the accumulated current of the sub-pixel of each organic light emitting diode panel 210 is equal to or greater than an allowable value.

Figure 6A:
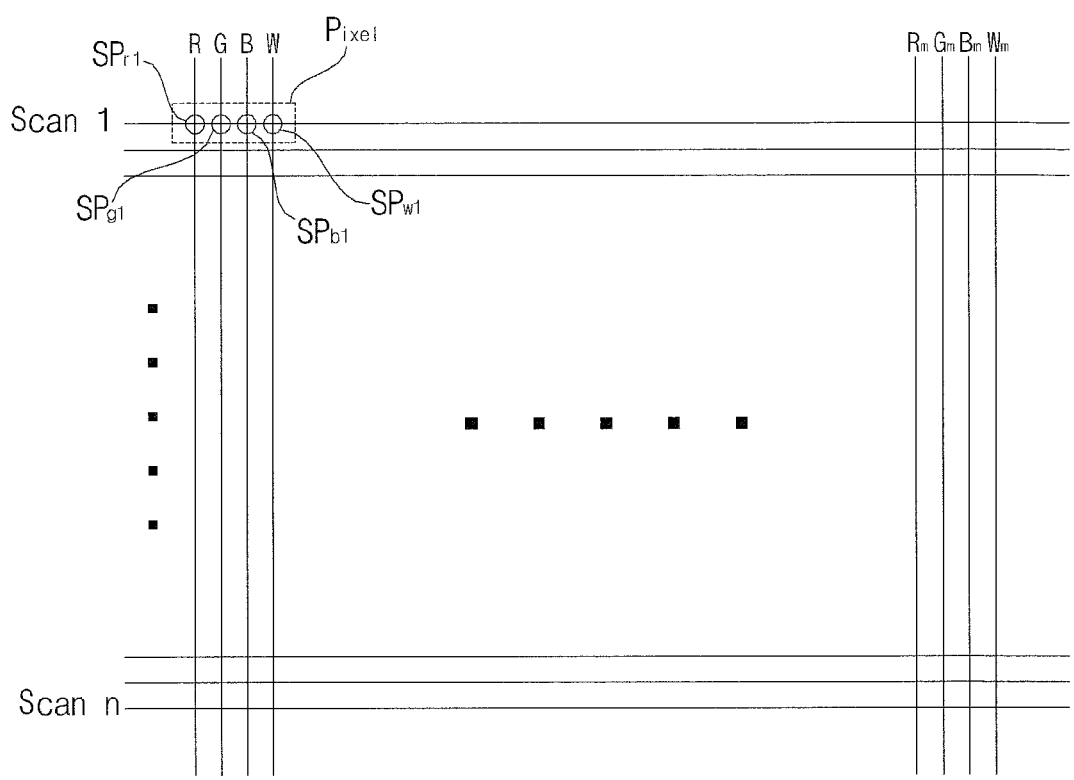
FIG. 6A and FIG. 6B are diagrams referred to in the description of an organic light emitting diode panel of FIG. 5.
Figure 6B:
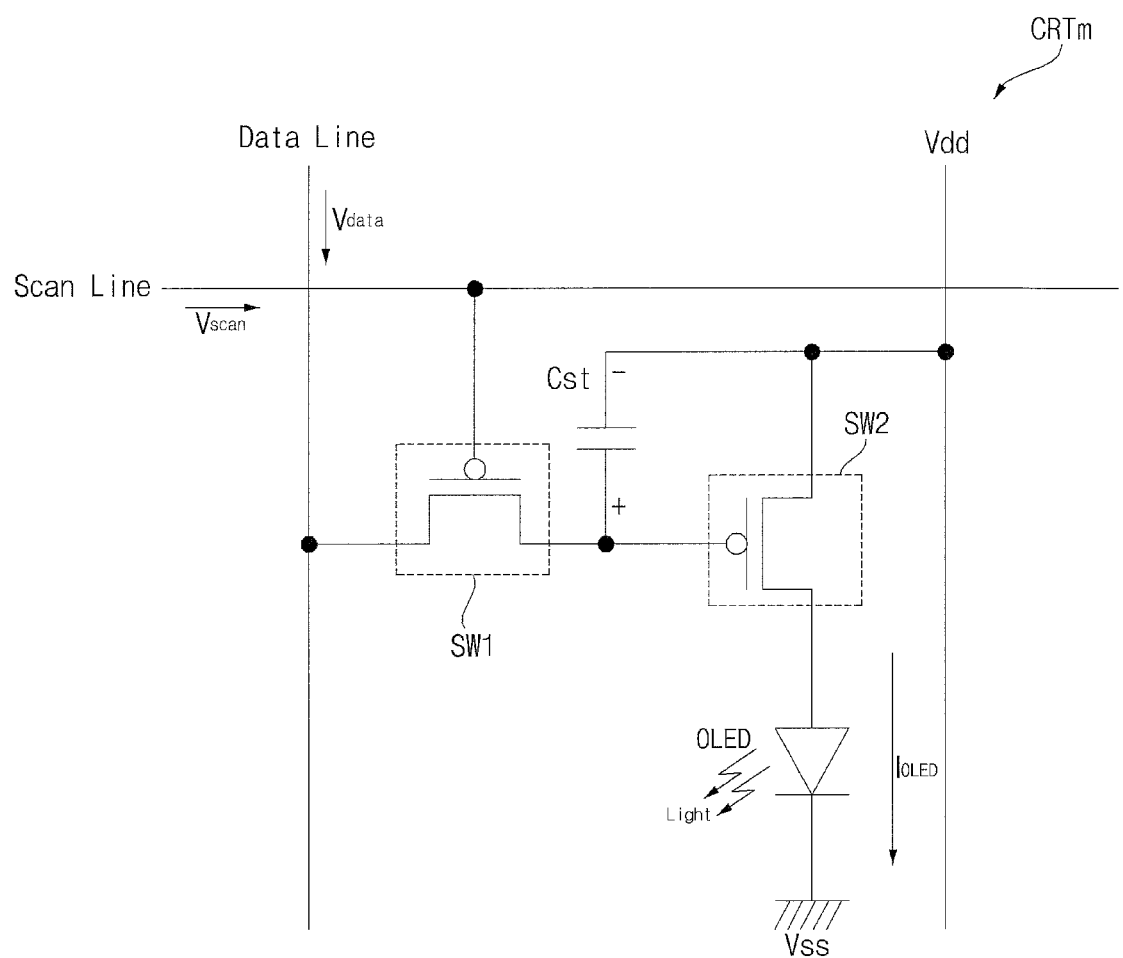

FIG. 6A and FIG. 6B are diagrams referred to in the description of an organic light emitting diode panel of FIG. 5.

Firstly, FIG. 6A is a diagram illustrating a pixel in the organic light emitting diode panel 210.

Referring to drawing, the organic light emitting diode panel 210 may include a plurality of scan lines $Scan_1$ to $Scan_n$, and a plurality of data lines R1, G1, B1, W1 to $R_m$, $G_m$, $B_m$, $W_m$ intersecting the scan lines.

Meanwhile, a pixel (subpixel) is defined in an intersecting area of the scan line and the data line in the organic light emitting diode panel 210. In the drawing, a pixel including sub-pixels SR1, SG1, SB1 and SW1 of RGBW is shown.

FIG. 6B illustrates a circuit of any one sub-pixel in the pixel of the organic light emitting diode panel of FIG. 6A.

Referring to drawing, an organic light emitting sub pixel circuit (CRTm) may include, as an active type, a scan switching element SW1, a storage capacitor Cst, a drive switching element SW2, and an organic light emitting layer (OLED).

The scan switching element SW1 is turned on according to the input scan signal Vdscan, as a scan line is connected to a gate terminal. When it is turned on, the input data signal Vdata is transferred to the gate terminal of a drive switching element SW2 or one end of the storage capacitor Cst.

The storage capacitor Cst is formed between the gate terminal and the source terminal of the drive switching element SW2, and stores a certain difference between a data signal level transmitted to one end of the storage capacitor Cst and a DC power (VDD) level transmitted to the other terminal of the storage capacitor Cst.

For example, when the data signal has a different level according to a Plume Amplitude Modulation (PAM) method, the power level stored in the storage capacitor Cst varies according to the level difference of the data signal Vdata.

For another example, when the data signal has a different pulse width according to a Pluse Width Modulation (PWM) method, the power level stored in the storage capacitor Cst varies according to the pulse width difference of the data signal Vdata.

The drive switching element SW2 is turned on according to the power level stored in the storage capacitor Cst. When the drive switching element SW2 is turned on, the driving current (IOLED), which is proportional to the stored power level, flows in the organic light emitting layer (OLED). Accordingly, the organic light emitting layer OLED performs a light emitting operation.

The organic light emitting layer OLED may include a light emitting layer (EML) of RGBW corresponding to a subpixel, and may include at least one of a hole injecting layer (HIL), a hole transporting layer (HTL), an electron transporting layer (ETL), and an electron injecting layer (EIL). In addition, it may include a hole blocking layer, and the like.

Meanwhile, all the subpixels emit a white light in the organic light emitting layer OLED. However, in the case of green, red, and blue subpixels, a subpixel is provided with a separate color filter for color implementation. That is, in the case of green, red, and blue subpixels, each of the subpixels further includes green, red, and blue color filters. Meanwhile, since a white subpixel outputs a white light, a separate color filter is not required.

Meanwhile, in the drawing, it is illustrated that a p-type MOSFET is used for a scan switching element SW1 and a drive switching element SW2, but an n-type MOSFET or other switching element such as a JFET, IGBT, SIC, or the like are also available.

Meanwhile, the pixel is a hold-type element that continuously emits light in the organic light emitting layer (OLED), after a scan signal is applied, during a unit display period, specifically, during a unit frame.

Accordingly, as described above, when AC power is supplied to the power supply and then stopped, the data stored in the storage capacitor Cst should be consumed. Accordingly, when AC power is supplied again to the power supply, minimum turn-on standby period should be observed.

Meanwhile, the present invention suggests a method of quickly turning on the display 180 when AC power Vac is supplied to the power supply 190 of the image display apparatus 100, simply and at an inexpensive cost while considering the minimum turn-on standby period of the display 180. This will be described with reference to FIG. 12 and following drawings.

Figure 7:
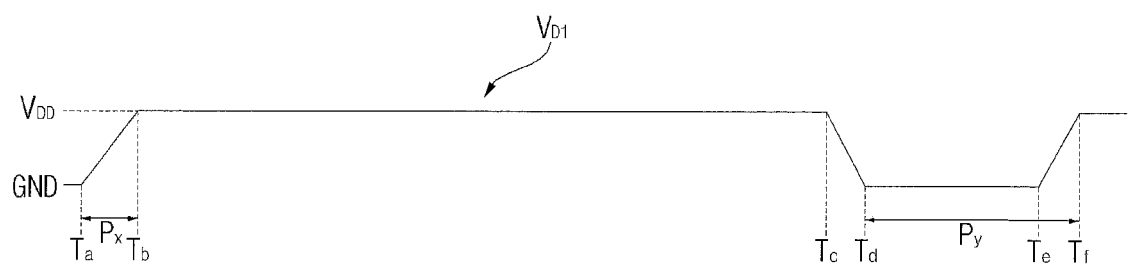
FIG. 7 is a diagram illustrating a voltage supplied to a display when AC power is supplied to a power supply.

FIG. 7 is a diagram illustrating a voltage supplied to a display when AC power is supplied to a power supply.

Referring to the drawing, when AC power is supplied to the power supply 190 at the time point of Ta, the operation power VDD is supplied to the panel 210 of the display 180 to be turned on, at a time point Tb, after a Px period.

Meanwhile, when the AC power supply is stopped at the time point Tc, the voltage applied to the panel 210 is lowered to the ground voltage GND at the time point Td.

Thereafter, when AC power is supplied again to the power supply 190 at the time point of Te, the voltage supplied to the panel 210 of the display 180 rises, and the operation power VDD is supplied to the panel 210 of the display 180 to be turned on at the time point of Tf.

At this time, it is preferable that the period from the time point Td to the time point Tf, or the period from the time point Tc to the time point Tf is equal to or longer than the minimum turn-on standby period so as to protect a panel.

Accordingly, various methods for securing a minimum turn-on standby period have been proposed, which will be described with reference to FIG. 8 and following drawings.

Figure 8:
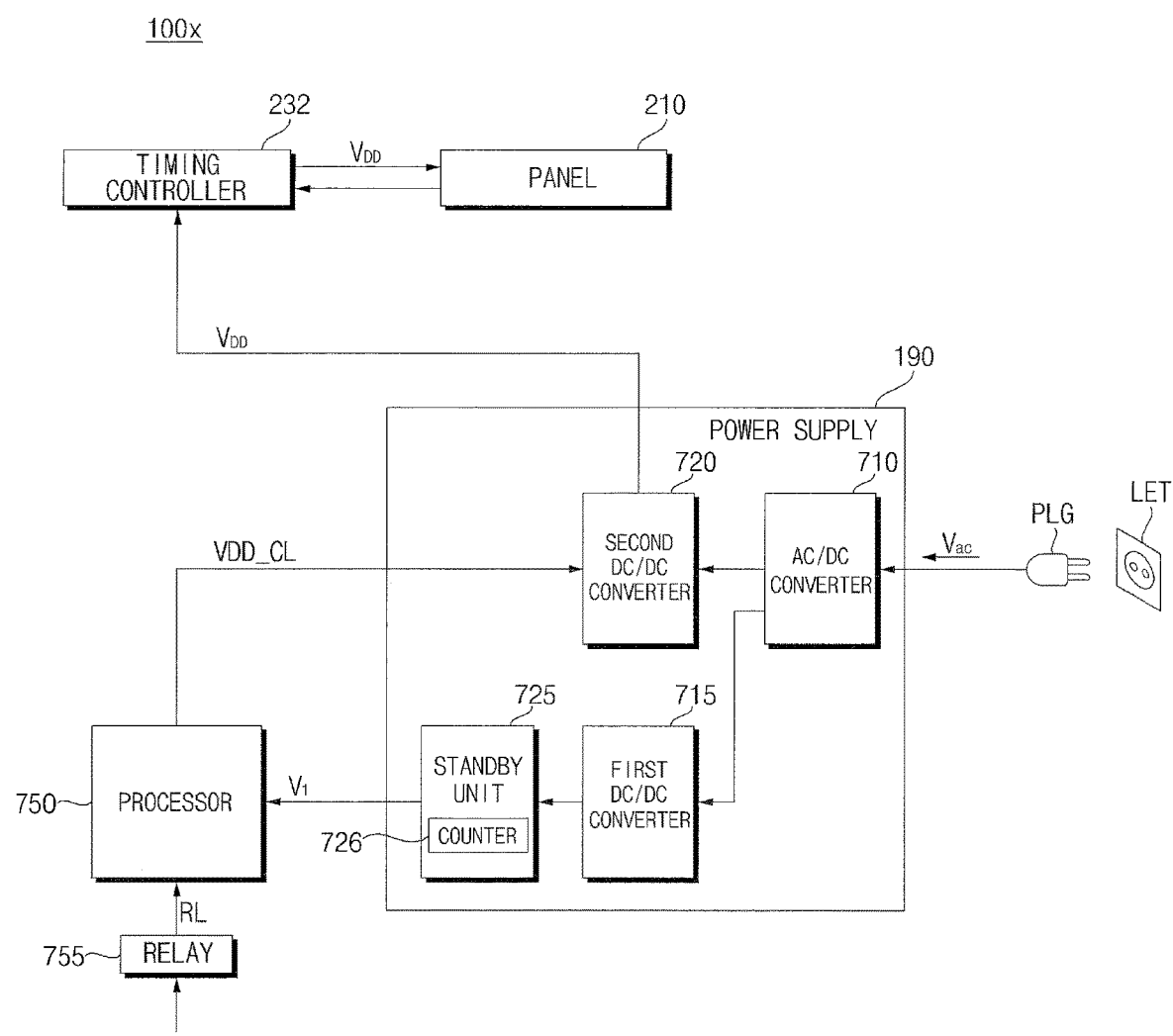
FIG. 8 is an example of an internal block diagram of an image display apparatus related to the present invention.
Figure 9A:
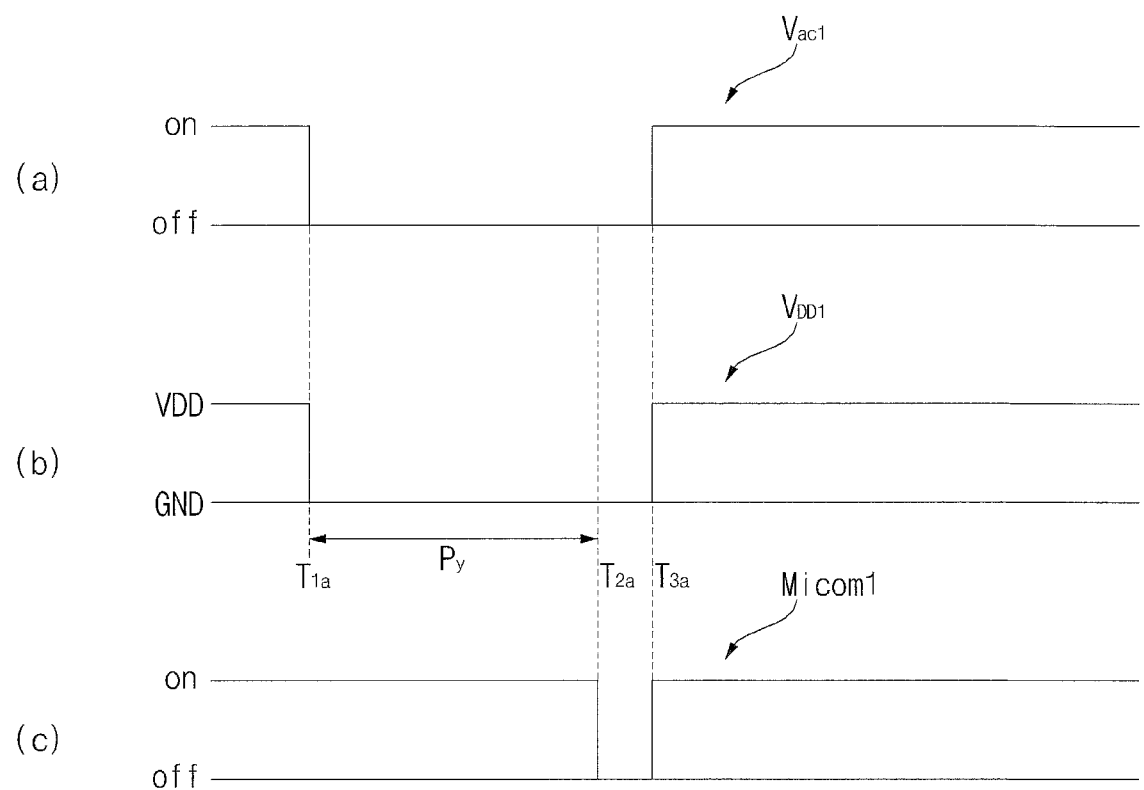
FIG. 9A and FIG. 9B are diagrams referred to in the description of FIG. 8.
Figure 9B:
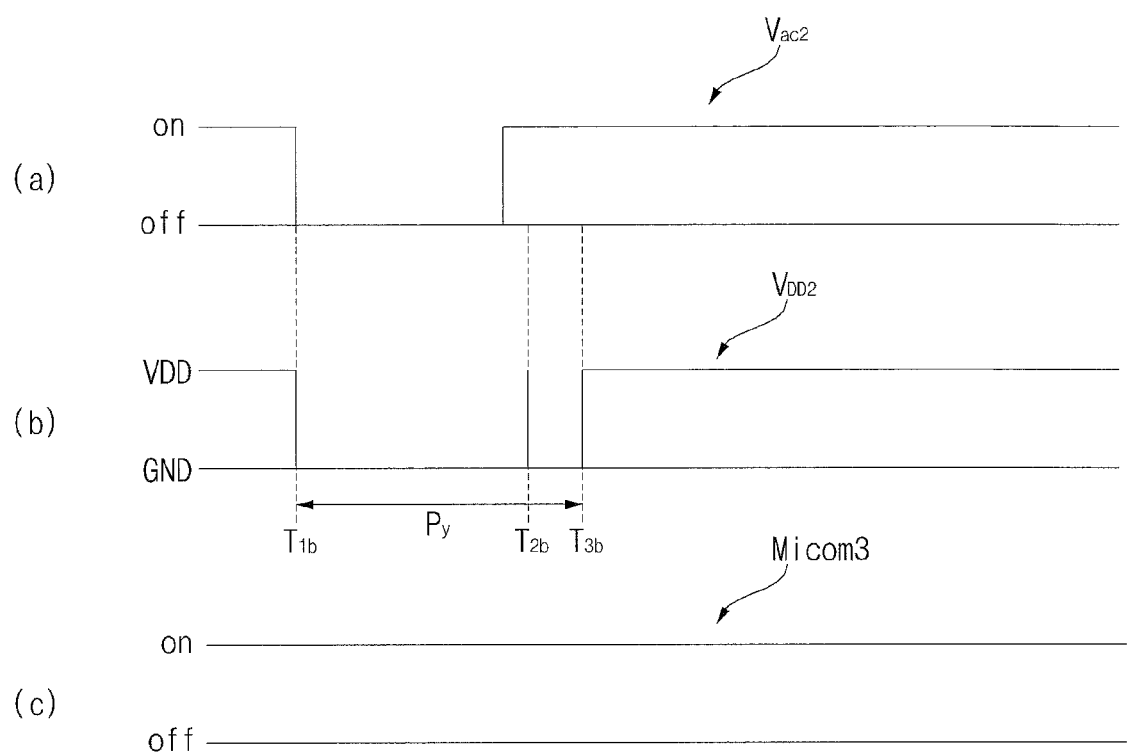

FIG. 8 is an example of an internal block diagram of an image display apparatus related to the present invention, and FIG. 9A and FIG. 9B are diagrams referred to in the description of FIG. 8.

Referring to drawing, the image display apparatus 100x of FIG. 8 may include a power supply 190, a processor 750, a relay 755, a timing controller 232, and a panel 210.

When a plug PLG is connected to an outlet, the AC power Vac is supplied to the power supply 190. When the plug PLG is detached from the outlet, the AC power Vac is not supplied to the power supply 190.

The power supply 190 may include an AC/DC converter 710 for converting an AC power Vac into a DC power, a first DC/DC converter 715 for converting the level of the DC power, a second DC/DC converter 720, and a standby unit 725 for supplying standby power when the power is off.

Meanwhile, when a power-on signal from the remote controller 200 is received, the relay 755 operates and an operation signal RL may be input to the processor 750.

The processor 750 receives an operation power V1 from the power supply 190 and operates to output a power control signal VDD_CL to the power supply 190.

The power supply 190 may output the operation power VDD to the timing controller 232 in response to the power control signal VDD_CL, and the timing controller 232 may output the operation power VDD to the panel 210.

Meanwhile, the image display apparatus 100x of FIG. 8 may operate as a waveform shown in FIG. 9A and FIG. 9B. Meanwhile, the minimum turn-on standby period of the panel 210 may be Py.

FIG. 9A shows a state in which a plug PLG is connected to an outlet to supply a AC power Vac, the plug PLG is detached from the outlet at the time point T1a not to supply the AC power Vac, and the plug PLG is connected again to the outlet at the time point T3a, after the minimum turn-on standby period Py, to supply the AC power Vac.

Accordingly, FIG. 9A(a) illustrates a AC power waveform Vac1 inputted to the power supply 190. That is, it may be turned off at time point T1a, and may be turned on again at time point T3a, after the minimum turn-on standby period Py.

Meanwhile, it is assumed that the standby unit 725 of FIG. 8 includes a counter 726, and the processor 750 of FIG. 8 does not include a counter.

When the AC power Vac is not supplied to the power supply 190, the standby unit 725 of the power supply 190 outputs the standby power for a certain period so that the processor 750 maintains a standby mode. Here, the certain period may correspond to the minimum turn-on standby period Py of the panel 210.

Thus, even if the AC power Vac is not supplied to the power supply 190 at the time point T1a as shown in FIG. 9A(c), the processor 750 of FIG. 8 can maintain the turn-on state due to the power of the standby unit 725 outputted from the standby unit 725 of the power supply 190.

In addition, as shown in FIG. 9A(c), the processor 750 of FIG. 8 may maintain the turn-on state, approximately, from the time point T1a to the time point T2a, which is the minimum turn-on standby period Py, may be turned-off from the time point T2a to the time point T3a, and may be turned on again from the time point T3a.

Meanwhile, from the time point T1a at which the AC power Vac is not supplied, the processor 750 does not output the power control signal VDD_CL, and output the power control signal VDD_CL at the time point T3a, after the minimum turn-on standby period Py.

Thus, as shown in FIG. 9A(b), the second DC/DC converter 720 of the power supply 190 does not output the operation power VDD from the time point T1a to the time point T3a, and outputs the operation power VDD after the time T3a.

Meanwhile, according to an operation power waveform VDD1 of FIG. 9A(b), the panel 210 may be turned on. That is, when the VDD is supplied, the panel 210 is turned on, and when the GND is supplied, the panel 210 is turned off.

In this case, even if the supply of the AC power Vac to the power supply 190 is stopped and then resumed, the operation power VDD is supplied after the minimum turn-on standby period Py of the panel 210, so that the panel 210 can be operated stably.

Next, FIG. 9B shows a state in which the plug PLG is connected to the outlet to supply a AC power Vac, the plug PLG is detached from the outlet at the time point T1b not to supply the AC power Vac, and the plug PLG is connected again to the outlet at the time point T2b, before the minimum turn-on standby period Py, to supply the AC power Vac.

Accordingly, FIG. 9B(a) illustrates a AC power waveform Vac2 inputted to the power supply 190. That is, it may be turned off at time point T1b, and may be turned on again at time point T2b, before the minimum turn-on standby period Py.

When the AC power Vac is not supplied to the power supply 190, the standby unit 725 of the power supply 190 outputs the standby power for a certain period so that the processor 750 maintains a standby mode. Here, the certain period may correspond to the minimum turn-on standby period Py of the panel 210.

Thus, even if the AC power Vac is not supplied to the power supply 190 at the time point T1b as shown in FIG. 9B(c), the processor 750 of FIG. 8 can maintain the turn-on state due to the power of the standby unit 725 outputted from the standby unit 725 of the power supply 190.

As a result, as shown in FIG. 9B(c), despite the stop of the AC power supply at the time point of T1b, the processor 750 of FIG. 8 may maintain the turn-on state due to the power of the standby unit 725, and may continuously maintain the turn-on state when the AC power is supplied again at the time point T2b.

Meanwhile, from the time point T1b at which the AC power Vac is not supplied, the processor 750 does not output the power control signal VDD_CL. Even if the AC power is supplied again at the time point T2b, the processor 750 does not output the power control signal VDD_CL during a period from the time point T2b to the time point T3b, as the minimum turn-on standby period Py is not elapsed.

Then, the processor 750 finally outputs the power control signal VDD_CL at a time point T3b, after the minimum turn-on standby period Py is elapsed from the time point T1b.

Accordingly, as shown in FIG. 9B(b), the second DC/DC converter 720 of the power supply 190 does not output the operation power VDD from the time point T1b to the time point T3b, and outputs the operation power VDD from the time point T3b.

Meanwhile, according to the operation power waveform VDD2 of FIG. 9B(b), the panel 210 may be turned on. That is, when the VDD is supplied, the panel 210 is turned on, and when the GND is supplied, the panel 210 is turned off.

In this case, even if the supply of the AC power Vac to the power supply 190 is stopped and then resumed before the minimum turn-on standby period Py of the panel 210, the operation power VDD is finally supplied only after the minimum turn-on standby period Py of the panel 210 is elapsed, so that the panel 210 can be operated stably.

Meanwhile, according to the image display apparatus 100x of FIG. 8, the power supply 190 should be provided with a separate standby unit 725, and the counter 726 for counting the minimum turn-on standby period Py should be provided. Since the use of such a standby unit 725 and a counter 728 adds additional manufacturing cost, and the like, the present invention intends not to include such a standby unit 725, counter 728, and the like.

That is, it is assumed that the power supply 190 or the processor 750 of the image display apparatus 100 according to the embodiment of the present invention does not have the counter 726.

In addition, it is assumed that the power supply 190 in the image display apparatus 100 according to the embodiment of the present invention does not include the standby unit 725. This will be described with reference to FIG. 12 and the following drawings.

Figure 10:
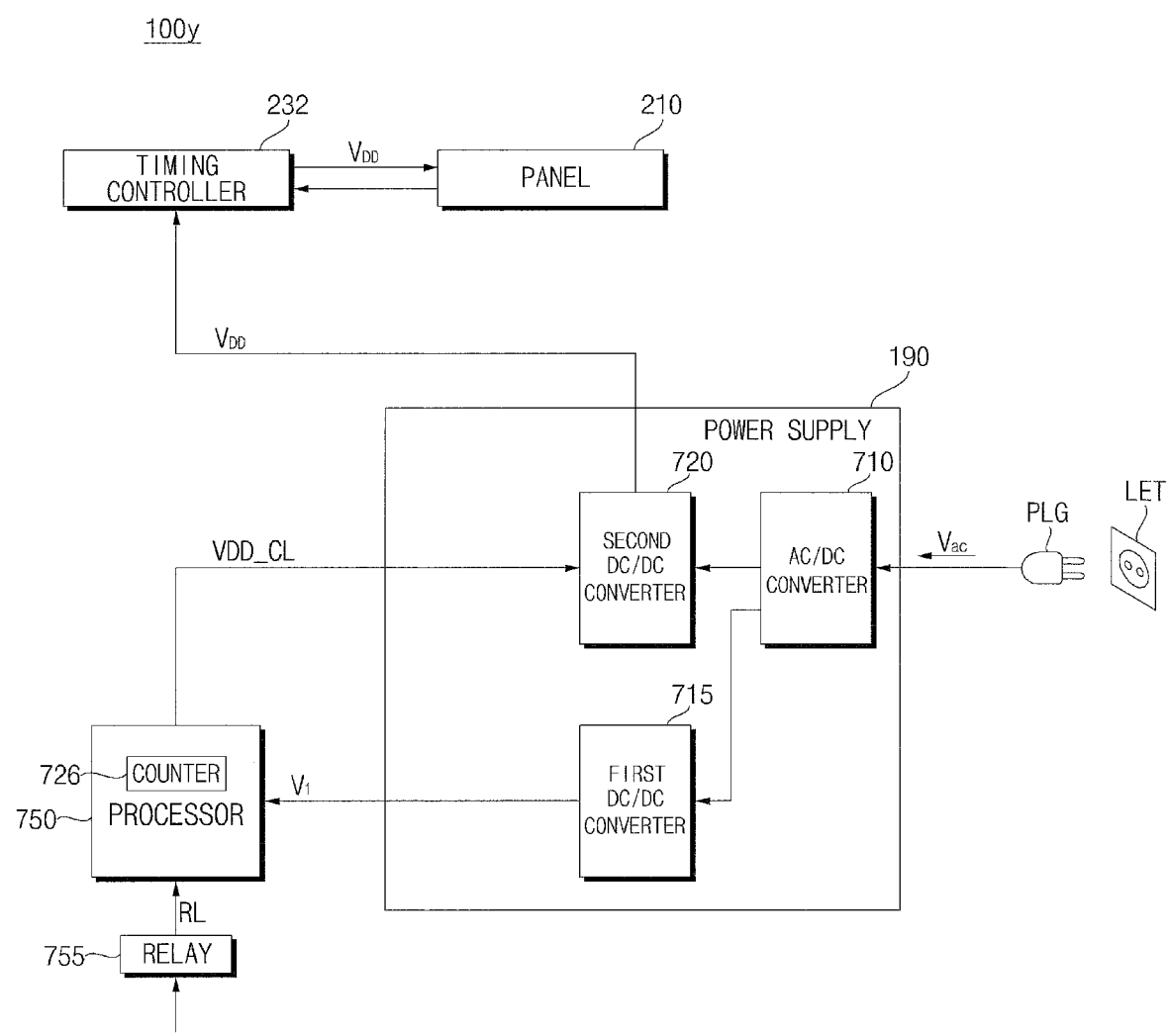
FIG. 10 is another example of an internal block diagram of an image display apparatus related to the present invention.
Figure 11A:
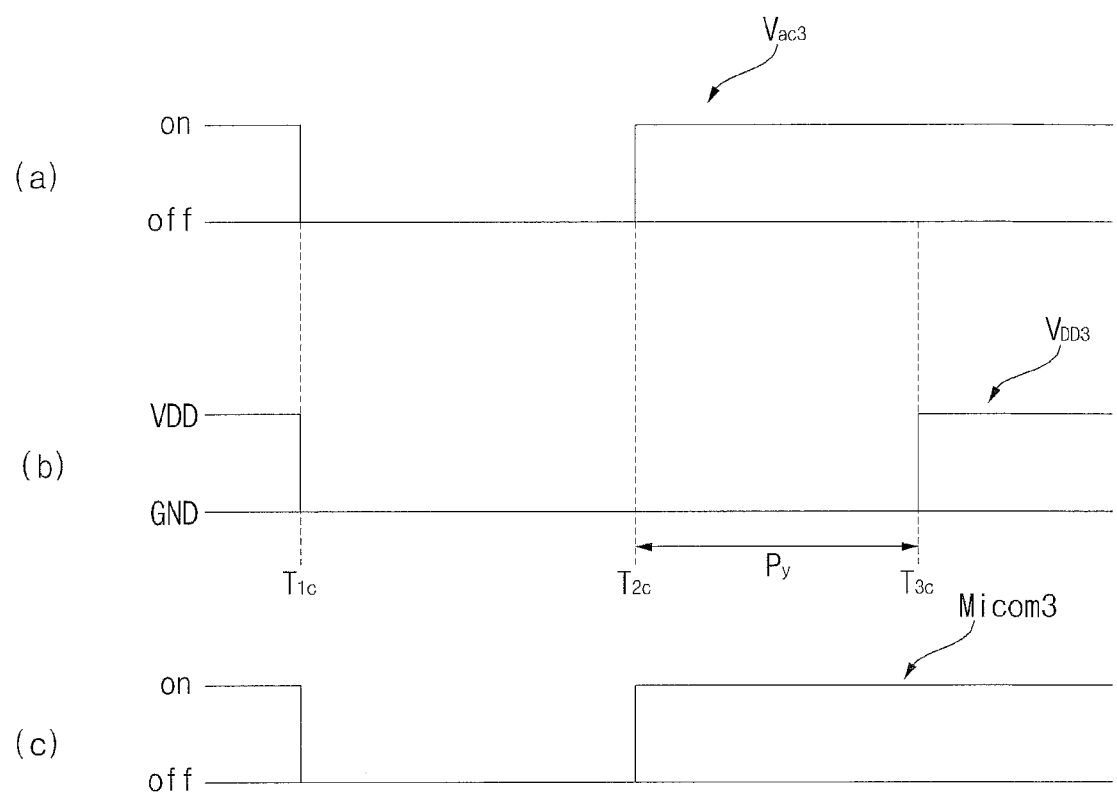
FIG. 11A and FIG. 11B are diagrams referred to in the description of FIG. 10.
Figure 11B:
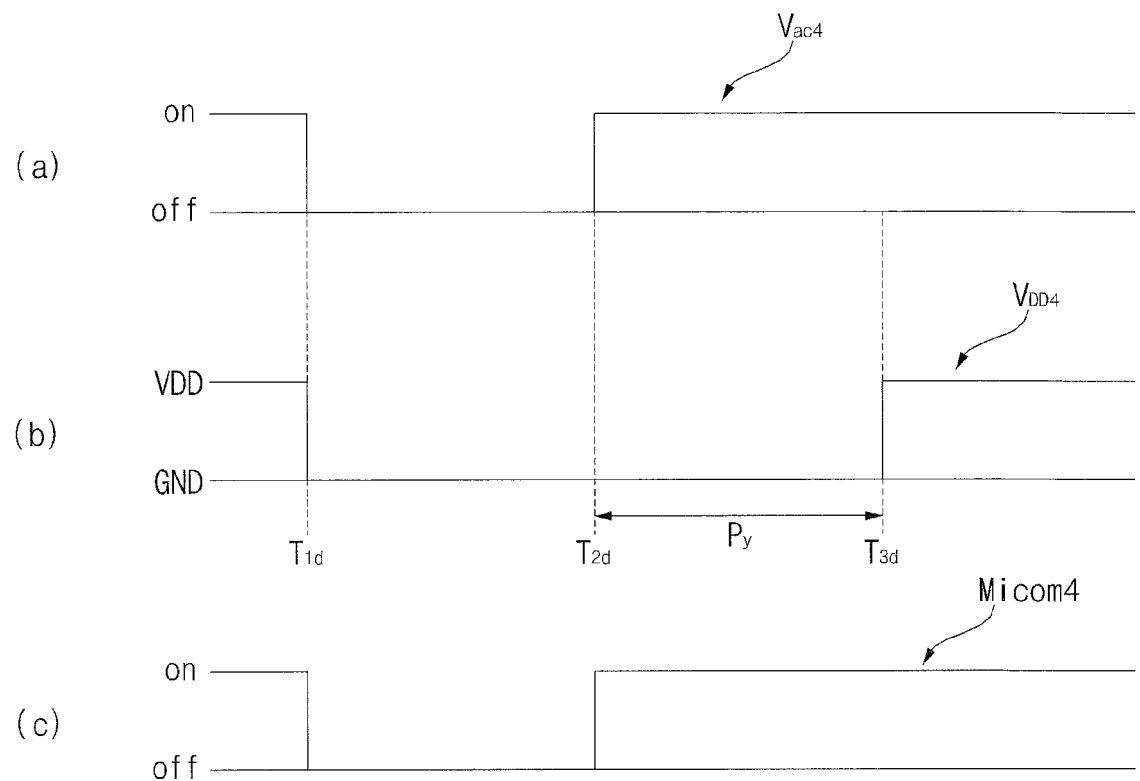

FIG. 10 is another example of an internal block diagram of an image display apparatus related to the present invention, and FIG. 11A and FIG. 11B are diagrams referred to in the description of FIG. 10.

Referring to drawing, similarly to the image display apparatus 100x of FIG. 8, an image display apparatus 100y of FIG. 10 may include the power supply 190, the processor 750, the relay 755, the timing controller 232, and the panel 210.

However, unlike FIG. 8, the power supply 190 does not include the standby unit 725, but the counter 726 is provided in the processor 750.

Thus, the description of the power supply 190, the processor 750, the relay 755, the timing controller 232, and the panel 210 will be omitted with reference to the description of FIG. 8.

Meanwhile, since the standby unit 725 is not provided, when the AC power Vac is not supplied to the power supply 190, the processor 750 is immediately turned off.

Meanwhile, the image display apparatus 100y of FIG. 10 may operate like a waveform shown in FIG. 11A and FIG. 11B. Meanwhile, the minimum turn-on standby period of the panel 210 may be Py.

Firstly, FIG. 11A shows a state in which a plug PLG is connected to an outlet to supply a AC power Vac, the plug PLG is detached from the outlet, at the time point T1c after the minimum turn-on standby period Py, not to supply the AC power Vac, and the plug PLG is connected again to the outlet at the time point T2c to supply the AC power Vac.

FIG. 11A(a) illustrates a AC power waveform Vac3 inputted to the power supply 190. That is, it may be turned off at time point T1c, and may be turned on again at time point T3c, after the minimum turn-on standby period Py.

Accordingly, as shown in FIG. 11A(c), the processor 750 of FIG. 11 is turned off at time point T1c, and turned on at time point T2c.

Meanwhile, since the processor 750 includes the counter 726, the processor 750 may output the power control signal VDD_CL at the time point T3c, after the minimum turn-on standby period Py is elapsed from the time point T2c at which the AC power Vac is supplied again.

That is, as shown in FIG. 11A(b), the processor 750 does not output the power control signal VDD_CL from the time point T1c to the time point T3c, and may output the power control signal VDD_CL from the time point T3c.

Accordingly, as shown in FIG. 11A(b), the second DC/DC converter 720 of the power supply 190 does not output the operation power VDD from the time point T1c to the time point T3c, and outputs the operation power VDD from the time point T3c.

Meanwhile, the panel 210 may be turned on according to an operation power waveform VDD3 of FIG. 11A(b). That is, when the VDD is supplied, the panel 210 is turned on, and when the GND is supplied, the panel 210 is turned off.

Next, FIG. 11B shows a state in which a plug PLG is connected to an outlet to supply a AC power Vac, the plug PLG is detached from the outlet at the time point T1d not to supply the AC power Vac, and the plug PLG is connected again to the outlet at the time point T2d, before the minimum turn-on standby period Py, to supply the AC power Vac.

Accordingly, FIG. 11B(a) illustrates a AC power waveform Vac4 inputted to the power supply 190. That is, it may be turned off at time point T1d, and may be turned on again at time point T2d, before the minimum turn-on standby period Py.

Accordingly, as shown in FIG. 11B(d), the processor 750 of FIG. 11 is turned off at the time point T1d and turned on at the time point T2d.

Meanwhile, since the processor 750 includes the counter 726, the processor 750 may output the power control signal VDD_CL at the time point T3d, after the minimum turn-on standby period Py is elapsed from the time point T2d at which the AC power Vac is supplied again.

That is, as shown in FIG. 11B(b), the processor 750 does not output the power control signal VDD_CL from the time point T1d to the time point T3d, and may output the power control signal VDD_CL from the time point T3d.

Accordingly, as shown in FIG. 11B(b), the second DC/DC converter 720 of the power supply 190 does not output the operation power VDD from the time point T1d to the time point T3d, and outputs the operation power VDD from the time point T3d.

Meanwhile, the panel 210 may be turned on according to an operation power waveform VDD4 of FIG. 11B(b). That is, when the VDD is supplied, the panel 210 is turned on, and when the GND is supplied, the panel 210 is turned off.

Meanwhile, referring to FIGS. 11A and 11B, when the supply of the AC power Vac to the power supply 190 is stopped and then resumed, the operation power VDD is not supplied during the minimum turn-on standby period Py after the supply of the AC power Vac. Therefore, there is a problem that the turn-on operation of the panel 210 is delayed considerably. As described above, when the minimum turn-on standby period Py is about 3 seconds, there occurs inconvenience that the panel 210 is not turned on for about 3 seconds after the AC power is supplied.

As a result, according to the image display apparatus 100y of FIG. 10, since the power supply 190 does not include a separate standby unit 725, even if the counter 726 is provided in the processor 750 or the like, there occurs inconvenience that the panel 210 is not turned on, for about 3 seconds, after the AC power is supplied.

Accordingly, the present invention does not include the standby unit 725, and intends to quickly turn on the display 180, particularly, the panel 210 when the AC power is resumed, without using a separate counter. This will be described with reference to FIG. 12 and the following drawings.

Figure 12:
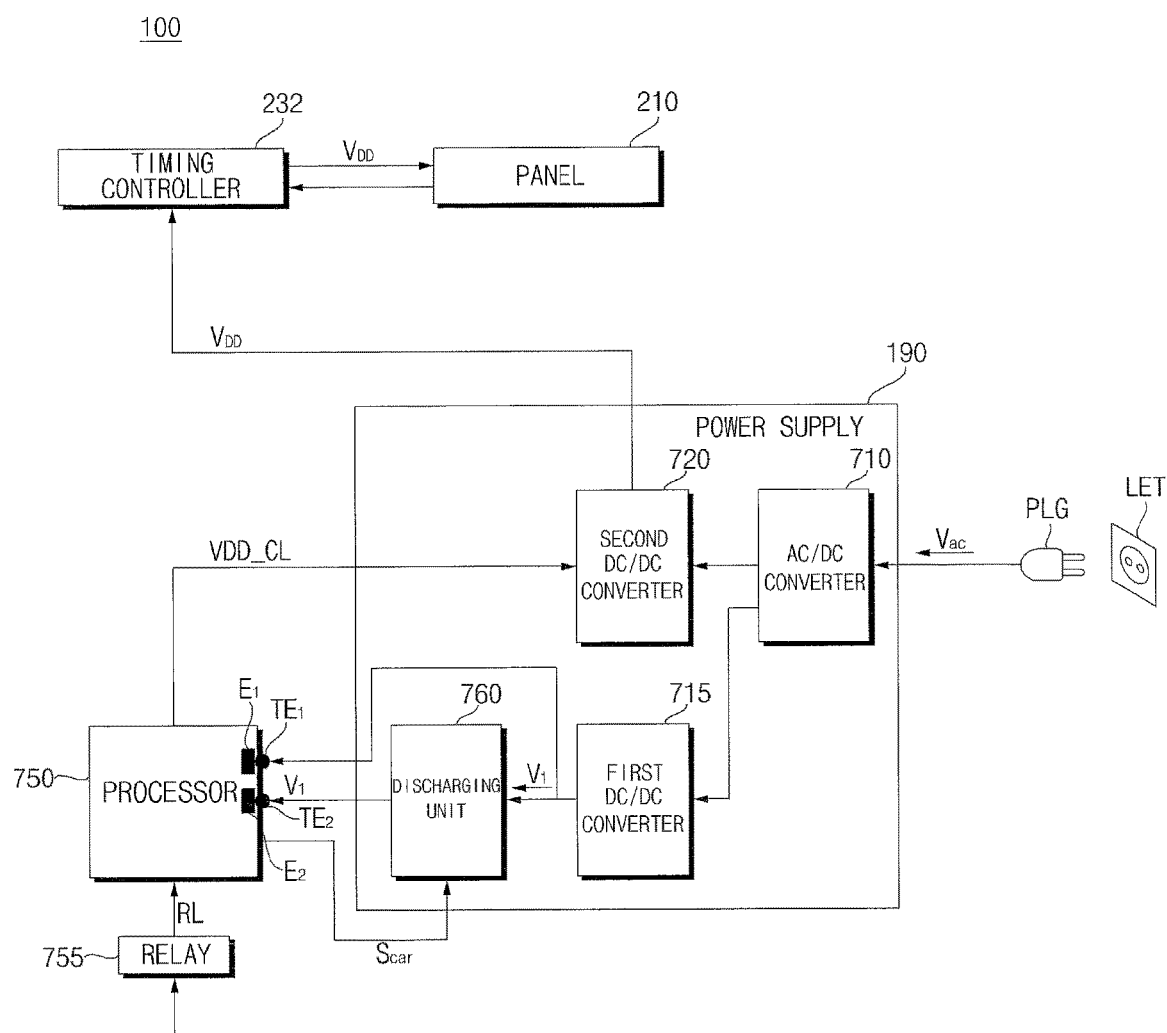
FIG. 12 is an example of an internal block diagram of an image display apparatus according to an embodiment of the present invention.

FIG. 12 is an example of an internal block diagram of an image display apparatus according to an embodiment of the present invention, and FIG. 13 to FIG. 15C are diagrams referred to in the description of FIG. 12.

Referring to drawing, the image display apparatus 100 of FIG. 12 may include the power supply 190, the processor 750, the relay 755, the timing controller 232, and the panel 210.

Meanwhile, when the power-on signal from the remote controller 200 is received while the AC power Vac is supplied to the power supply 190, the relay 755 operates and the operation signal RL And may be input to the processor 750. That is, the processor 750 may be operated by the turn-on operation of the relay.

When the plug PLG is connected to the outlet, the AC power Vac is supplied to the power supply 190, and the AC power is not supplied to the power supply 190 when the plug PLG is detached from the outlet.

The power supply 190 may include an AC/DC converter 710 for converting an AC power Vac into a DC power, a first DC/DC converter 715 for converting the converted DC power into a first DC power V1, a second DC/DC converter 720 for converting the converted DC power into a second DC power V2, and a discharging unit 760 for discharging the first DC power V1 when the supply of the AC power Vac to the power supply 190 is stopped.

Figure 13:
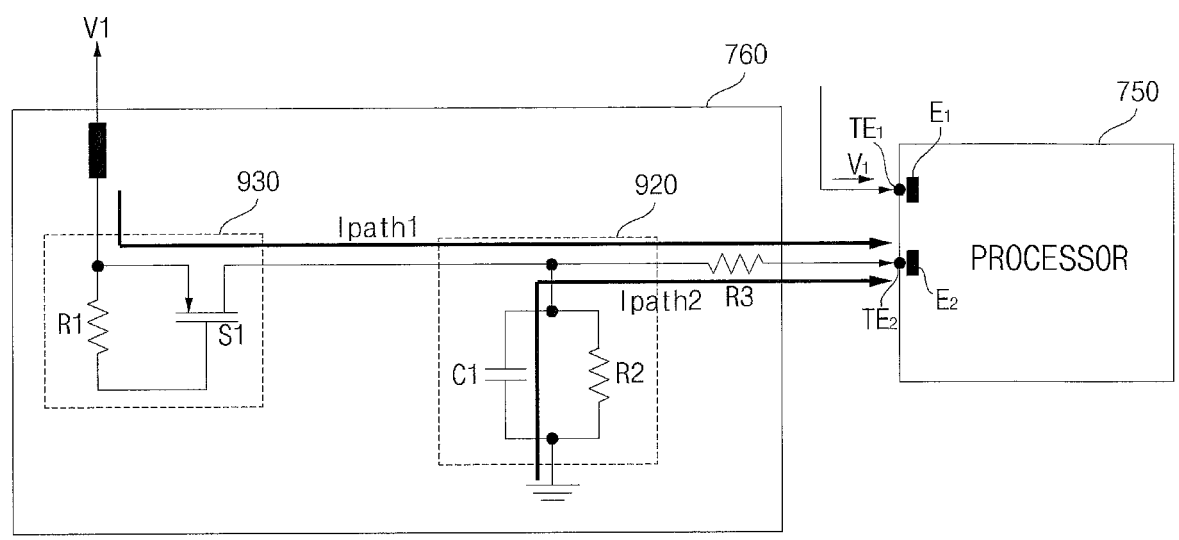
FIG. 13 to FIG. 15C are diagrams referred to in the description of FIG. 12.

As shown in FIG. 13, the discharging unit 760 may include a switching unit 930 having a switching element S1 and a power storage unit 920 having a capacitor C1.

FIG. 13 further illustrates that a resistor R1 connected in parallel to the switching element S1 is provided in the switching unit 930 and a resistor R2 connected in parallel to the capacitor C1 is provided in the power storage unit 920.

Meanwhile, the operation of the switching element S1 in the discharging unit 760 may be controlled by the operation control signal of the processor 750.

For example, due to the turn-on of the switching element S1, the first DC power V1 from the power supply 190 is stored in the capacitor C1 through a first current path Ipath1, and the first DC power V1 is supplied to the processor 750.

Meanwhile, due to the turn-off of the switching element S1, the voltage stored in the capacitor C1 is discharged through a second current path Ipath2, and the discharge voltage from the capacitor C1 is supplied to the processor 750.

Figure 14:
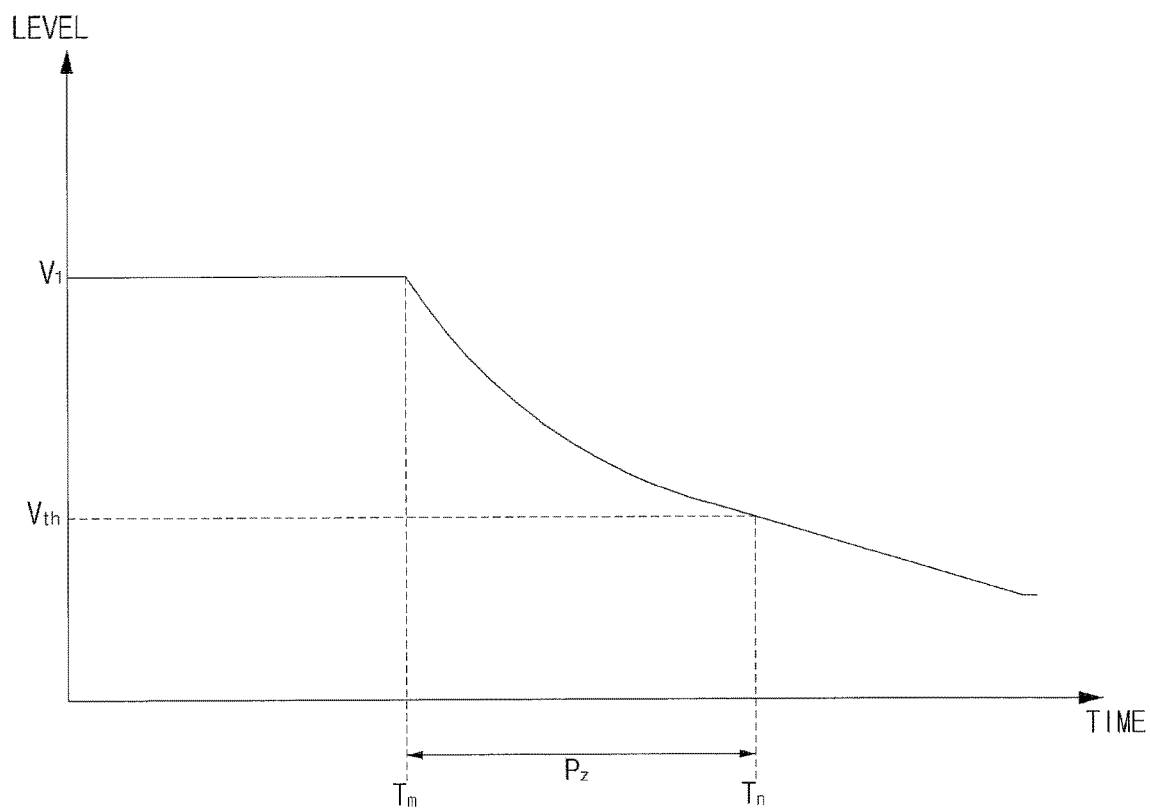

Meanwhile, FIG. 14 is a diagram showing a voltage level which is output according to the operation of the switching element S1 in the discharging unit 760.

Referring to drawing, the switching element S1 may be turned on until the time point Tm, and the switching element S1 may be turned off after the time point Tm.

Accordingly, the voltage level output from the discharging unit 760 maintains V1 until the time point Tm, and the energy stored in the capacitor C1 is discharged after the time point Tm, so that the voltage level is gradually descended as shown in the drawing.

Meanwhile, the time constant at the time of gradual descending may be determined by a RC value, and may be determined, approximately, by the capacitance of the capacitor C1, the resistance value of a resistance element R2, and the like. Meanwhile, in the present invention, such a RC time constant is used.

The period Pz during which the voltage level descends from the voltage V1 to a reference value Vth is designed to correspond to the above described minimum turn-on standby period Py. By using this, the minimum turn-on standby period Py at the time of the re-supply of the AC power Vac may be secured, and the panel may be quickly turned on.

That is, when the supply of the AC power Vac to the power supply 190 is stopped, it is preferable that the period Pz during which the level of the first DC power descends from the first level V1 to the reference value Vth corresponds to the minimum turn-on standby period Py of the display 180.

The processor 750 according to the embodiment of the present invention may control the second DC power VDD to be supplied to the display 180 according to the level of the voltage output from the discharging unit 760, when the supply of the AC power Vac to the power supply 190 is stopped and then resumed.

In detail, when the level of the voltage output from the discharging unit 760 at the time of the re-supply of the AC power Vac to the power supply 190 is equal to or lower than the reference value Vth, the processor 750 may control the second DC power VDD to be supplied to the display 180. In this case, when the AC power Vac is supplied to the power supply 190 of the image display apparatus 100, the display 180 can be quickly turned on.

Meanwhile, when the level of the voltage output from the discharging unit 760 at the re-supply of the AC power Vac to the power supply 190 exceeds the reference value Vth, the processor 750 may control the second DC power VDD not to be supplied to the display 180. Thus, the minimum turn-on standby period Py of the display 180 set in the display 180 may be maintained.

Then, the processor 750 may control the second DC power VDD to be supplied to the display 180, after the level of the voltage output from the discharging unit 760 reaches the reference value Vth. Accordingly, the display 180 may be quickly turned on, in consideration of the minimum turn-on standby period Py of the display 180 set in the display 180.

Meanwhile, the organic light emitting diode panel 210 includes a plurality of pixels, and the pixel may include an organic light emitting layer OLED, a drive switching element S1 which is connected to the organic light emitting layer OLED and performs switching by using the second DC power VDD, and a storage capacitor Cst connected to the drive switching element S1.

At this time, the voltage stored in the storage capacitor Cst of each pixel of the organic light emitting diode panel 210 is descended to the ground voltage GND during the minimum turn-on standby period Py, thereby enabling accurate image display.

Meanwhile, since the standby unit 725 is removed from the power supply 190, the manufacturing cost of the power supply 190 is reduced.

In addition, since the power supply 190 or the processor 750 does not include the counter 726, the manufacturing cost is reduced.

Meanwhile, the processor 750 may include a first terminal TE1 for receiving the first DC power V1 and a second terminal TE2 for receiving the first DC power V1 via the discharging unit 760.

Accordingly, the processor 750 may directly receive the first DC power V1 output from the first DC/DC converter 715 through the first terminal TE1 without passing through the discharging unit 760.

Meanwhile, the processor 750 may directly determine whether the AC power is input to the power supply 190 according to the level of the voltage input through the first terminal TE1.

For example, when the first level V1 is inputted through the first terminal TE1, the processor 750 may determine that the AC power is supplied to the power supply 190, and when the ground voltage GND is input through the first terminal TE1, the processor 750 may determine that the AC power is not supplied to the power supply 190.

To this end, the processor 750 may further include a first voltage detector E1 for detecting a voltage level input to the first terminal TEL Alternatively, unlike the drawing, the first voltage detector E1 can be separately provided outside the processor 750.

Meanwhile, the processor 750 may immediately determine whether the minimum turn-on standby period Py is elapsed after the stop of the AC power supply, according to the level of the voltage input through the second terminal TE2.

For example, after the stop of the AC power supply, when the voltage input through the first terminal TE1 is higher than the reference value Vth, the processor 750 determines that the minimum turn-on standby period Py is not elapsed. When the voltage input through the first terminal TE1 is the reference value Vth, the processor 750 may determine that it reaches the minimum turn-on standby period Py.

To this end, the processor 750 may further include a second voltage detector E2 for detecting a voltage level inputted to the second terminal TE2. Alternatively, unlike the drawing, the second voltage detector E2 may be separately provided outside the processor 750.

Meanwhile, when the voltage level inputted through the first terminal TE1 descends from a high level to a low level, the processor 750 may control the second DC power VDD not to be supplied to the display 180. When the voltage level inputted through the first terminal TE1 is the high level and the voltage level inputted through the second terminal TE2 is equal to or lower than the reference value Vth, the processor 750 may control the second DC power VDD to be supplied to the display 180.

Meanwhile, unlike the drawing, the processor 750 may not include the first terminal E1 and the first voltage detector E1, but may include only the second terminal E2 and the second voltage detector E2.

At this time, when the supply of the AC power Vac to the power supply 190 is stopped and the voltage level inputted through the terminal TE2 descends from the first level V1 which is a high level, the processor 750 may control the second DC power VDD not to be supplied to the display 180. When the AC power Vac is supplied again to the power supply 190 and the voltage level inputted through the terminal TE2 is equal to or lower than the reference value Vth, the processor 750 may control the second DC power VDD to be supplied to the display 180.

Meanwhile, when the level of the voltage detected by the voltage detector E2 at the time point of re-supply of the AC power Vac to the power supply 190 is equal to or lower than the reference value Vth, the processor 750 may control the second DC power VDD to be supplied to the display 180.

The processor 750 receives the first DC power V1 from the power supply 190 and operates to output the power control signal VDD_CL to the power supply 190.

The power supply 190 may output the second DC power VDD to the timing controller 232 in response to the power control signal VDD_CL, and the timing controller 232 may supply the second DC power VDD to the panel 210.

Figure 15A:
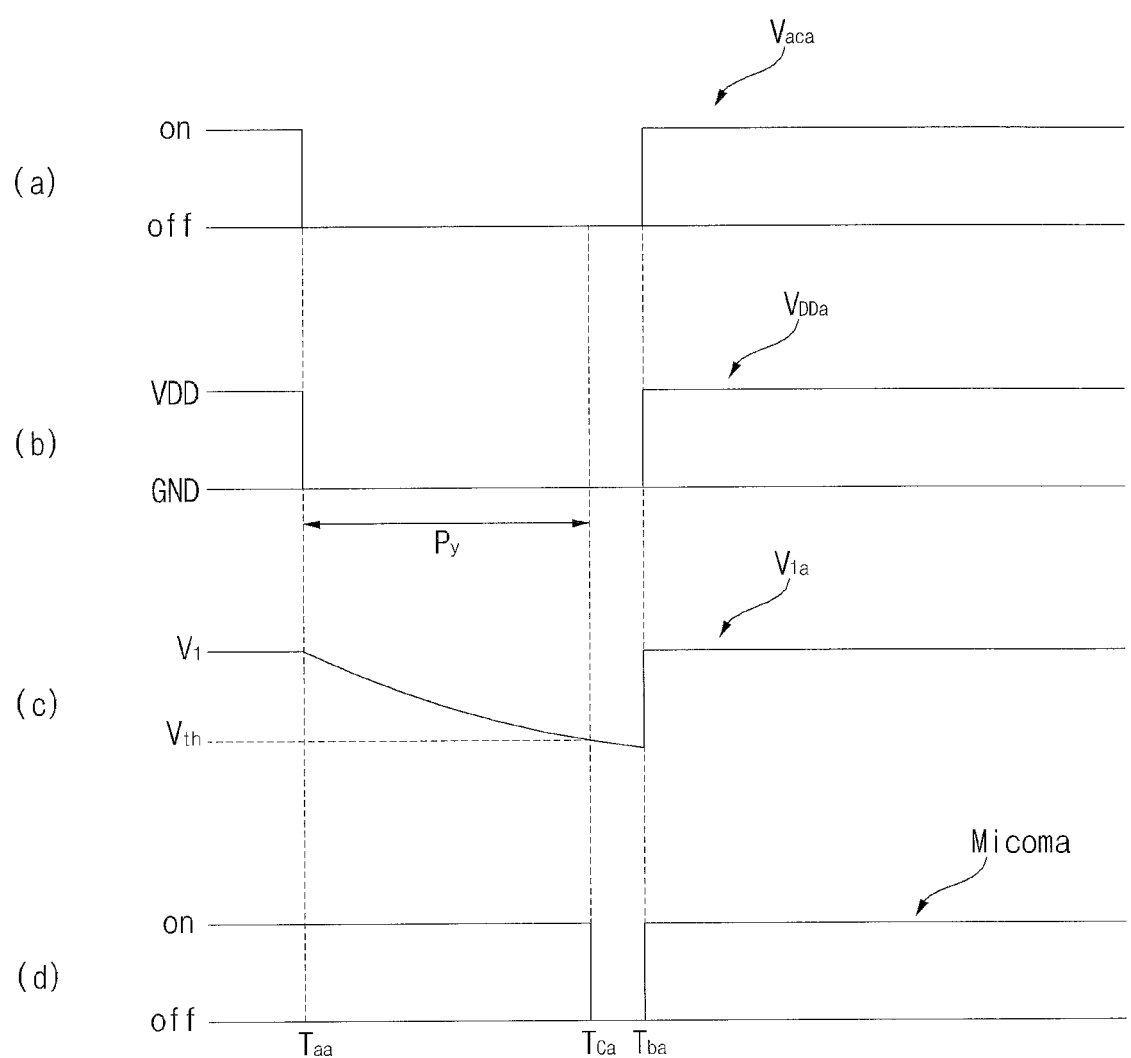
Figure 15B:
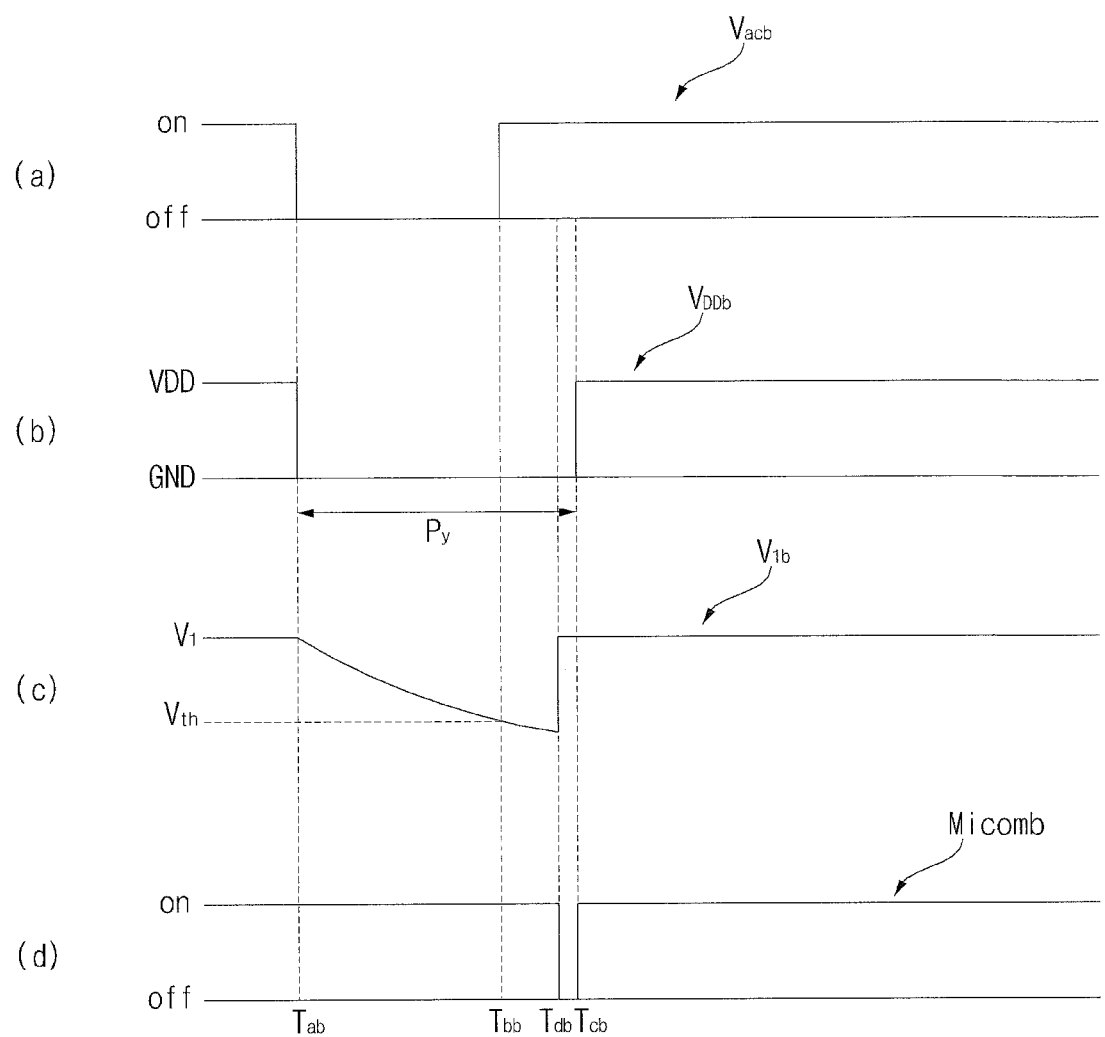

Meanwhile, the image display apparatus 100 of FIG. 12 may operate as shown in FIG. 15A and FIG. 15B. Meanwhile, the minimum turn-on standby period of the panel 210 may be Py.

Firstly, FIG. 15A shows a state in which a plug PLG is connected to an outlet to supply a AC power Vac, the plug PLG is detached from the outlet at the time point Taa not to supply the AC power Vac, and the plug PLG is connected again to the outlet at the time point Tba, after the minimum turn-on standby period Py, to supply the AC power Vac.

Accordingly, FIG. 15A(a) illustrates a AC power waveform Vaca inputted to the power supply 190. That is, it may be turned off at time point Taa, and may be turned on again at time point Tba, after the minimum turn-on standby period Py.

When the AC power Vac is not supplied to the power supply 190, the discharging unit 760 of the power supply 190 performs discharging from the time point Taa. That is, the switching element S1 may be turned off, and the voltage stored in the capacitor C1 may be outputted.

Thus, as shown in FIG. 15A(c), the level of the voltage waveform V1a outputted from the discharging unit 760 is gradually descended.

Meanwhile, the time point at which the level of the voltage waveform V1a outputted from the discharging unit 760 is gradually descended and reaches the reference value Vth is illustrated as Tca.

Even if the AC power Vac is not supplied to the power supply 190, as shown in FIG. 15A(d), the processor 750 may maintain the turn-on state until the time point Tca, due to the voltage waveform V1a outputted from the discharging unit 760, may be turned off from the time point Tca to the time point Tba at which the AC power Vac is supplied, and may be turned on again from the time point Tba.

Meanwhile, the minimum turn-on standby period Py of the display 180 is satisfied, when the level of the voltage waveform V1a outputted from the discharging unit 760 is gradually descended, reaches the reference value Vth, and then the supply of the AC power Vac is resumed, so that the processor 750 can output the power control signal VDD_CL to the power supply 190 at the time point Tba.

That is, the processor 750 does not output the power control signal VDD_CL from the time point Taa at which the AC power Vac is not supplied, and may output again the power control signal VDD_CL at the time point Tba, after the minimum turn-on standby period Py.

Thus, as shown in FIG. 15A(b), the second DC/DC converter 720 of the power supply 190 does not output the second DC power VDD from the time point Taa to the time point Tba, and outputs the second DC power VDD after the time point Tba.

Meanwhile, the panel 210 may be turned on according to the operation power waveform VDDa shown in FIG. 15A (b). That is, when the VDD is supplied, the panel 210 is turned on, and when the GND is supplied, the panel 210 is turned off.

In this case, even if the supply of the AC power Vac to the power supply 190 is stopped and then resumed, the second DC power VDD is supplied after the minimum turn-on standby period Py of the panel 210, such that the panel 210 can be operated stably and quickly.

Next, FIG. 15B shows a state in which a plug PLG is connected to an outlet to supply a AC power Vac, the plug PLG is detached from the outlet at the time point Tab not to supply the AC power Vac, and the plug PLG is connected again to the outlet at the time point Tbb, before the minimum turn-on standby period Py, to supply the AC power Vac.

Accordingly, FIG. 15B(a) illustrates a AC power waveform Vacb inputted to the power supply 190. That is, it may be turned off at time point Tab, and may be turned on again at time point Tbb, before the minimum turn-on standby period Py.

When the AC power Vac is not supplied to the power supply 190, the discharging unit 760 of the power supply 190 performs discharging from the time point Tab. That is, the switching element S1 may be turned off, and the voltage stored in the capacitor C1 may be outputted.

Thus, as shown in FIG. 15B(c), the level of the voltage waveform V1*b* outputted from the discharging unit 760 is gradually descended.

Meanwhile, the time point at which the level of the voltage waveform V1*b* outputted from the discharging unit 760 is gradually descended and reaches the reference value Vth is illustrated as Tdb after the time point Tbb.

Even if the supply of the AC power Vac to the power supply 190 is resumed at the time point Tbb, the level of the voltage waveform V1*b* outputted from the discharging unit 760 is larger than the reference value Vth, such that the processor 750 can control the power control signal VDD_CL not to be supplied to the power supply 190.

Meanwhile, even if the AC power Vac is not supplied to the power supply 190, as shown in FIG. 15B(d), due to the voltage waveform V1*b* outputted from the discharging unit 760, the processor 750 may maintain the turn-on state until the time point Tdb, may be temporarily turned off from time point Tdb to the time point Tcb, and may be turned on again from the time point Tcb.

Alternatively, since the voltage waveform V1*b* outputted from the discharging unit 760 is equal to or higher than the reference value Vth, the processor 750 can be continuously turned on, unlike the case of FIG. 15B(d).

Meanwhile, the processor 750 may output the power control signal VDD_CL to the power supply 190, at the time point Tcb, after the level of the voltage waveform V1*a* outputted from the discharging unit 760 is gradually descended and reaches the reference value Vth.

Alternatively, unlike this, the processor 750 may output the power control signal VDD_CL to the power supply 190, at the time point Tdb when the level of the voltage waveform V1*a* outputted from the discharging unit 760 is gradually descended and reaches the reference value Vth.

That is, the processor 750 does not output the power control signal VDD_CL from the time point Tab at which the AC power Vac is not supplied, and may output again the power control signal VDD_CL after the minimum turn-on standby period Py.

Thus, as shown in FIG. 15B(b), the second DC/DC converter 720 of the power supply 190 does not output the second DC power VDD from the time point Tab to the time point Tcb, and outputs the second DC power VDD after the time point Tcb.

Meanwhile, the panel 210 may be turned on according to the operation power waveform VDDa shown in FIG. 15B (b). That is, when the VDD is supplied, the panel 210 is turned on, and when the GND is supplied, the panel 210 is turned off.

In this case, even if the supply of the AC power Vac to the power supply 190 is stopped and then resumed, the second DC power VDD is supplied after the minimum turn-on standby period Py of the panel 210, such that the panel 210 can be operated stably and quickly.

Figure 15C:
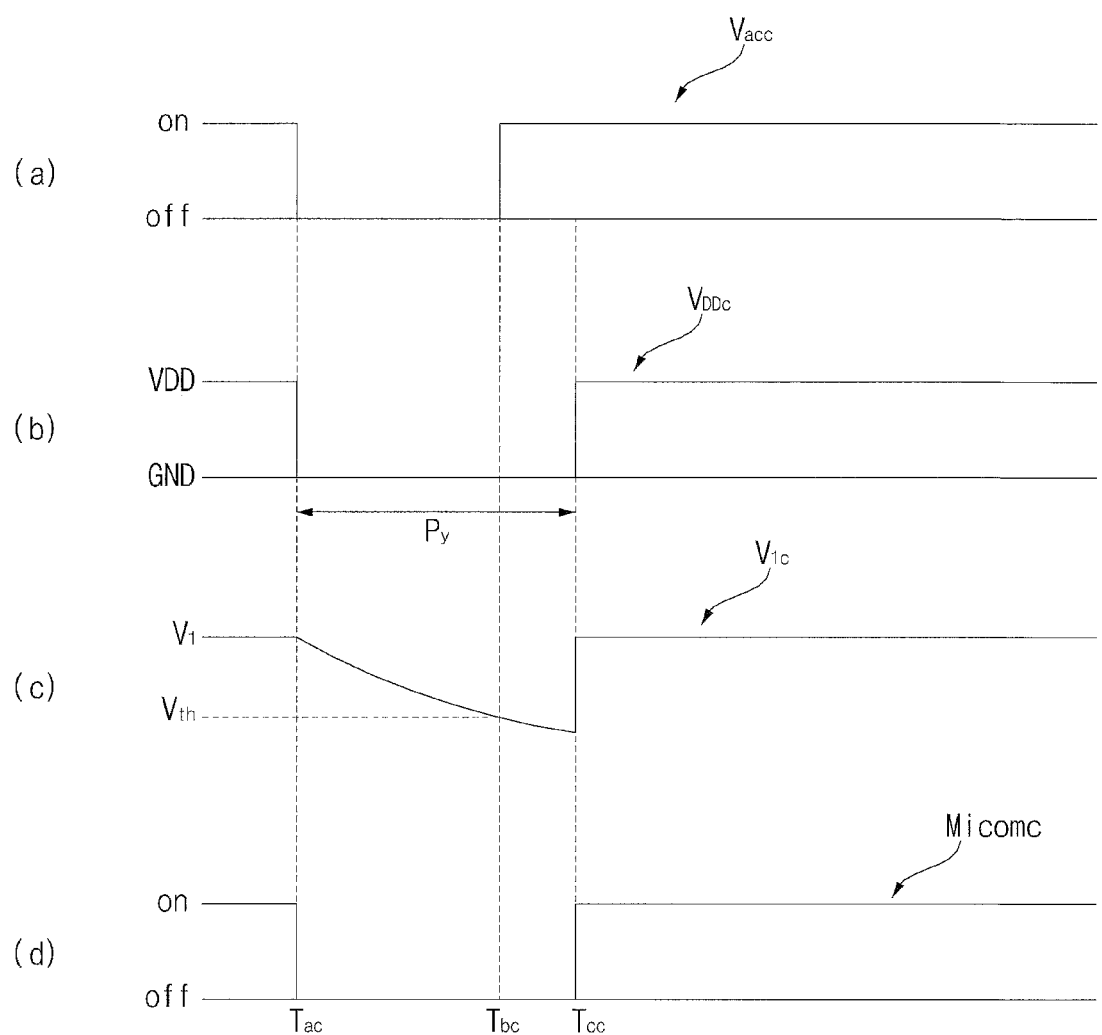

Next, FIG. 15C shows a state in which a plug PLG is connected to an outlet to supply a AC power Vac, the plug PLG is detached from the outlet at the time point Tac not to supply the AC power Vac, and the plug PLG is connected again to the outlet at the time point Tbc, before the minimum turn-on standby period Py, to supply the AC power Vac.

Accordingly, FIG. 15C(a) illustrates a AC power waveform Vacc inputted to the power supply 190. That is, it may be turned off at time point Tac, and may be turned on again at time point Tbc, before the minimum turn-on standby period Py.

When the AC power Vac is not supplied to the power supply 190, the discharging unit 760 of the power supply 190 performs discharging from the time point Tac. That is, the switching element S1 may be turned off, and the voltage stored in the capacitor C1 may be outputted.

Thus, as shown in FIG. 15C(c), the level of the voltage waveform V1*c* outputted from the discharging unit 760 is gradually descended.

Meanwhile, the time point at which the level of the voltage waveform V1*c* outputted from the discharging unit 760 is gradually descended and reaches the reference value Vth is illustrated as Tcc after the time point Tbc.

Even if the supply of the AC power Vac to the power supply 190 is resumed at the time point Tbc, the level of the voltage waveform V1*c* outputted from the discharging unit 760 is larger than the reference value Vth, such that the processor 750 can control the power control signal VDD_CL not to be outputted to the power supply 190.

Meanwhile, when the AC power Vac is not supplied to the power supply 190, the processor 750 may be temporarily turned off. That is, as shown in FIG. 15C(d), it may be turned off at the time point Tac, and may be turned on at the time point Tcc.

Alternatively, since the voltage waveform V1*c* outputted from the discharging unit 760 is continuously equal to or higher than the reference value Vth, the processor 750 can be continuously turned on, unlike the case of FIG. 15C(d).

Meanwhile, the processor 750 may output the power control signal VDD_CL to the power supply 190, at the time point Tcc after the level of the voltage waveform V1*a* outputted from the discharging unit 760 is gradually descended and reaches the reference value Vth.

That is, the processor 750 does not output the power control signal VDD_CL from the time point Tac at which the AC power Vac is not supplied, and may output again the power control signal VDD_CL at the time point Tcc after the minimum turn-on standby period Py.

Thus, as shown in FIG. 15C(c), the second DC/DC converter 720 of the power supply 190 does not output the second DC power VDD from the time point Tac to the time point Tcc, and outputs the second DC power VDD after the time point Tcc.

Meanwhile, the panel 210 may be turned on according to the operation power waveform VDDa shown in FIG. 15C (c). That is, when the VDD is supplied, the panel 210 is turned on, and when the GND is supplied, the panel 210 is turned off.

In this case, even if the supply of the AC power Vac to the power supply 190 is stopped and then resumed, the second DC power VDD is supplied after the minimum turn-on standby period Py of the panel 210, such that the panel 210 can be operated stably and quickly.

Meanwhile, the operation method of the image display apparatus of the present invention can be implemented as a code that can be read by a processor on a recording medium readable by a processor included in the image display apparatus. The processor-readable recording medium includes all kinds of recording apparatuses in which data that can be read by the processor is stored. Examples of the recording medium readable by the processor include a ROM, a RAM, a CD-ROM, a magnetic tape, a floppy disk, an optical data storage apparatus, and the like, and may also be implemented in the form of a carrier wave such as transmission over the Internet. In addition, the processor-readable recording medium may be distributed over network-connected computer systems so that code readable by the processor in a distributed fashion can be stored and executed.

As is apparent from the above description, according to an embodiment of the present invention, there is provided an image display apparatus including a display, a processor configured to control to supply a power to the display, and a power supply configured to convert an input AC power and output converted first DC power and second DC power to the processor and the display, wherein the power supply comprises a discharging unit configured to discharge the first DC power when a supply of the AC power to the power supply is stopped, wherein the processor is configured to supply the second DC power to the display according to a level of a voltage outputted from the discharging unit, when the supply of the AC power to the power supply is stopped and then supplied again. Accordingly, when the AC power is supplied to the power supply of the image display apparatus, the display can be quickly turned on.

Particularly, the second DC power is controlled to be supplied to the display, when the level of the voltage outputted from the discharging unit at a time point of re-supply of the AC power to the power supply is equal to or lower than a reference value. Accordingly, when the AC power is supplied to the power supply of the image display apparatus, the display can be quickly turned on.

Meanwhile, the second DC power is controlled not to be supplied to the display, when the level of the voltage outputted from the discharging unit at a time point of re-supply of the AC power to the power supply exceeds a reference value. Accordingly, the minimum turn-on standby period of display set in the display can be maintained.

In addition, the second DC power is controlled to be supplied to the display, after the level of the voltage outputted from the discharging unit reaches the reference value. Accordingly, the display can be quickly turned on, in consideration of the minimum turn-on standby period of display set in the display.

Meanwhile, when the supply of the AC power to the power supply is stopped, a period when the level of the first DC power descends from a first level to a reference value is designed to correspond to a minimum turn-on standby period of the display. Accordingly, the display can be quickly turned on, in consideration of the minimum turn-on standby period of display set in the display.

Meanwhile, a voltage stored in a storage capacitor of each pixel of the organic light emitting diode panel is descended to a ground voltage, during the minimum turn-on standby period so that accurate image display can be achieved.

Meanwhile, since the standby unit is removed from the power supply, the manufacturing cost of the power supply is reduced.

Meanwhile, the processor includes a voltage detector configured to detect a voltage level inputted from the discharging unit, and the processor is configured to supply the second DC power to the display, when a level of voltage detected by the voltage detector at a time point of re-supply of the AC power to the power supply is equal to or lower than a reference value. Accordingly, the display can be quickly turned on, in consideration of the minimum turn-on standby period of display, and the manufacturing cost can be reduced.

According to another embodiment of the present invention, there is provided an image display apparatus including a display; a processor configured to control to supply a power to the display; and a power supply configured to convert an input AC power and output converted first DC power and second DC power to the processor and the display, wherein the power supply outputs a voltage level that gradually descends when a supply of the AC power is stopped, wherein the processor is configured to supply the second DC power to the display according to a voltage level from the power supply, when the supply of the AC power to the power supply is stopped and then supplied again. Accordingly, when the AC power is supplied to the power supply of the image display apparatus, the display can be quickly turned on.

Particularly, when the supply of the AC power to the power supply is stopped and then supplied again, if a voltage level from the power supply is equal to or lower a reference value, the second DC power is controlled to be supplied to the display. Accordingly, when the AC power is supplied to the power supply of the image display apparatus, the display can be quickly turned on.

Meanwhile, when a voltage level from the power supply at a time point of re-supply of the AC power to the power supply exceeds a reference value, the second DC power is controlled not to be supplied to the display. Accordingly, the minimum turn-on standby period of display set in the display can be maintained.

In addition, the second DC power is controlled to be supplied to the display after the voltage level from the power supply reaches a reference value. Accordingly, the display can be quickly turned on, in consideration of the minimum turn-on standby period of display set in the display.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

What is claimed is:

1. An image display apparatus comprising:
a display;
a processor configured to control to supply a power to the display; and
a power supply configured to convert an AC power and output converted first DC power to the processor and second DC power to the display,
wherein the power supply comprises a discharging unit configured to store the first DC power in a capacitor when the AC power is supplied to the power supply and to discharge a first voltage stored in the capacitor when a supply of the AC power to the power supply is stopped,
wherein the processor is configured to supply the second DC power to the display according to a level of the first voltage outputted from the discharging unit, when the AC power is supplied again to the power supply after the supply of the AC power to the power supply is stopped,
wherein the processor comprises a terminal configured to receive the level of the first voltage outputted from the discharging unit,
Wherein the level of the first voltage inputted through the terminal is descended from a first level which is a high level when the supply of the AC power to the power supply is stopped, and wherein the processor is configured to control the second DC power to be supplied to the display, when the AC power is supplied again to the power supply and the level of the first voltage inputted through the terminal is equal to or lower than a reference value.

2. The image display apparatus of claim 1, wherein the processor is configured to:
not supply the second DC power to the display, when the level of the voltage outputted from the discharging unit at a time point of re-supply of the AC power to the power supply exceeds the reference value, and
control the second DC power to be supplied to the display, after the level of the first voltage outputted from the discharging unit reaches the reference value.

3. The image display apparatus of claim 1, wherein the discharging unit comprises:
a switching unit including a switching element; and
a power storage unit including the capacitor,
wherein the first DC power from the power supply is stored in the capacitor due to a turn-on of the switching element,
wherein the first voltage stored in the capacitor is discharged due to a turn-off of the switching element, and the first voltage from the capacitor is supplied to the processor.

4. The image display apparatus of claim 1, wherein the discharging unit outputs the first DC power when the AC power is supplied to the power supply, and outputs the first voltage which is descended, when the supply of the AC power to the power supply is stopped.

5. The image display apparatus of claim 4, wherein, when the supply of the AC power to the power supply is stopped, a period when the level of the first voltage descends from the first level to the reference value corresponds to a minimum turn-on standby period of the display.

6. The image display apparatus of claim 5, wherein the display comprises an organic light emitting diode panel,
wherein a voltage stored in a storage capacitor of each pixel of the organic light emitting diode panel is descended to a ground voltage, during the minimum turn-on standby period.

7. The image display apparatus of claim 6, wherein the organic light emitting diode panel comprises a plurality of pixels,
wherein the pixel comprises:
an organic light emitting layer;
a drive switching element configured to be connected to the organic light emitting layer and perform switching by using the second DC power; and
the storage capacitor configured to be connected to the drive switching element,
wherein the voltage stored in the storage capacitor is descended to the ground voltage, during the minimum turn-on standby period.

8. The image display apparatus of claim 1, wherein the processor comprises a voltage detector configured to detect the level of the first voltage inputted from the discharging unit, and
wherein the processor is configured to supply the second DC power to the display, when the level of the first voltage detected by the voltage detector at a time point of re-supply of the AC power to the power supply is equal to or lower than the reference value.

9. The image display apparatus of claim 1, further comprising a voltage detector configured to detect the level of the voltage inputted from the discharging unit,
wherein the processor is configured to supply the second DC power to the display, when the level of the first voltage detected by the voltage detector at a time point of re-supply of the AC power to the power supply is equal to or lower than the reference value.

10. The image display apparatus of claim 1, further comprising a relay turned on when a power-on signal is input while the AC power is supplied to the power supply,
wherein the processor is operated due to a turn-on operation of the relay.

11. The image display apparatus of claim 1, wherein the power supply further comprises:
an AC/DC converter configured to convert the AC power into a DC power;
a first DC/DC converter configured to convert the converted DC power into the first DC power; and
a second DC/DC converter configured to convert the converted DC power into the second DC power.

12. The image display apparatus of claim 1, wherein the power supply or the processor does not include a counter.

13. The image display apparatus of claim 1, wherein the power supply does not include a standby unit.

14. An image display apparatus comprising:
a display;
a processor configured to control to supply a power to the display; and
a power supply configured to convert an AC power and output converted first DC power to the processor and second DC power to the display,
wherein the power supply comprises a discharging unit configured to store the first DC power in a capacitor when the AC power is supplied to the power supply and to discharge a first voltage stored in the capacitor when a supply of the AC power to the power supply is stopped,
wherein the processor is configured to supply the second DC power to the display according to a level of the first voltage outputted from the discharging unit, when the AC power to the power is supplied again supply after the supply of the AC power to the power supply is stopped,
wherein the processor comprises:
a first terminal configured to receive the first DC power; and
a second terminal configured to receive the level of the first voltage outputted from the discharging unit, and
wherein the level of the first voltage inputted through the second terminal is descended from a first level which is a high level when the supply of the AC power to the power supply is stopped, and
wherein the processor is configured to control the second DC power to be supplied to the display when the level of the second voltage inputted through the first terminal is a high level and the level of the first voltage inputted through the second terminal is equal to or lower than a reference value.

15. The image display apparatus of claim 14, wherein the processor comprises:
a first voltage detector configured to detect the level of the second voltage inputted to the first terminal; and
a second voltage detector configured to detect the level of the first voltage inputted to the second terminal.

16. An image display apparatus comprising:
a display;
a processor configured to control to supply a power to the display; and a power supply configured to convert an AC power and output converted first DC power to the processor and second DC power to the display, wherein the power supply outputs a voltage level that gradually descends when a supply of the AC power is stopped, wherein the processor is configured to supply the second DC power to the display according to the voltage level from the power supply, when the AC power is supplied again to the power supply after the supply of the AC power to the power supply is stopped, wherein the processor comprises a terminal configured to receive the voltage level from the power supply, and wherein the voltage level inputted through the terminal is descended from a first level which is a high level when the supply of the AC power to the power supply is stopped, and wherein the processor is configured to control the second DC power to be supplied to the display, when the AC power is supplied again to the power supply and the voltage level inputted through the terminal is equal to or lower than a reference value.

17. The image display apparatus of claim 16, wherein the processor is configured to:

not supply the second DC power to the display, when the voltage level from the power supply at a time point of re-supply of the AC power to the power supply exceeds the reference value, and control the second DC power to be supplied to the display after the voltage level from the power supply reaches the reference value.

* * * * *